(12) United States Patent
Choi et al.

(10) Patent No.: US 8,987,111 B2
(45) Date of Patent: Mar. 24, 2015

(54) METHOD OF MANUFACTURING A THREE DIMENSIONAL ARRAY HAVING BURIED WORD LINES OF DIFFERENT HEIGHTS AND WIDTHS

(71) Applicants: Jay-Bok Choi, Hwaseong-si (KR);
Jiyoung Kim, Yongin-si (KR);
Hyun-Woo Chung, Seoul (KR);
Sungkwan Choi, Hwaseong-si (KR);
Yoosang Hwang, Suwon-si (KR)

(72) Inventors: Jay-Bok Choi, Hwaseong-si (KR);
Jiyoung Kim, Yongin-si (KR);
Hyun-Woo Chung, Seoul (KR);
Sungkwan Choi, Hwaseong-si (KR);
Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/789,930

(22) Filed: Mar. 8, 2013

(65) Prior Publication Data

US 2013/0260531 A1    Oct. 3, 2013

(30) Foreign Application Priority Data

Mar. 30, 2012  (KR) .................. 10-2012-0032928

(51) Int. Cl.
| | | |
|---|---|---|
| H01L 21/76 | (2006.01) | |
| H01L 21/762 | (2006.01) | |
| H01L 21/308 | (2006.01) | |
| H01L 27/108 | (2006.01) | |

(52) U.S. Cl.
CPC ...... *H01L 21/76224* (2013.01); *H01L 21/3086* (2013.01); *H01L 27/10891* (2013.01)

USPC .......... 438/427; 438/424; 438/430; 438/420; 438/400

(58) Field of Classification Search
None
See application file for complete search history.

(56) References Cited

U.S. PATENT DOCUMENTS

| | | | |
|---|---|---|---|
| 7,098,105 | B2 | 8/2006 | Juengling |
| 7,582,931 | B2 | 9/2009 | Lee et al. |
| 7,675,110 | B2 | 3/2010 | Uchiyama |
| 7,745,319 | B2 | 6/2010 | Tang et al. |
| 7,851,303 | B2 | 12/2010 | Mikasa |
| 2005/0272233 | A1 | 12/2005 | Lee et al. |
| 2005/0277249 | A1 | 12/2005 | Juengling |
| 2006/0097314 | A1 | 5/2006 | Uchiyama |
| 2008/0050885 | A1 | 2/2008 | Tang et al. |
| 2009/0321805 | A1* | 12/2009 | Von Kluge et al. ........... 257/302 |
| 2010/0001331 | A1 | 1/2010 | Mikasa |
| 2010/0084703 | A1* | 4/2010 | Tsurumi et al. ............... 257/326 |
| 2011/0003459 | A1 | 1/2011 | Shin et al. |
| 2011/0018057 | A1 | 1/2011 | Kim |
| 2012/0211815 | A1* | 8/2012 | Mikasa ........................ 257/306 |

FOREIGN PATENT DOCUMENTS

| | | |
|---|---|---|
| KR | 20100001134 A | 1/2010 |
| KR | 20110000203 A | 1/2011 |
| KR | 20110003040 A | 1/2011 |

\* cited by examiner

*Primary Examiner* — Charles Garber
*Assistant Examiner* — Brigitte Paterson
(74) *Attorney, Agent, or Firm* — Harness, Dickey & Pierce, P.L.C.

(57) ABSTRACT

According to a method of fabricating a semiconductor device, a first mask pattern is used to etch first device isolation layers and active lines or form grooves, in which word lines will be provided. Thereafter, the active lines are etched in a self-alignment manner by using the first mask pattern as an etch mask. As a result, it is possible to suppress mask misalignment from occurring.

12 Claims, 50 Drawing Sheets

METHOD OF MANUFACTURING A THREE DIMENSIONAL ARRAY HAVING BURIED WORD LINES OF DIFFERENT HEIGHTS AND WIDTHS

CROSS-REFERENCE TO RELATED APPLICATIONS

This U.S. non-provisional patent application claims priority under 35 U.S.C. §119 to Korean Patent Application No. 10-2012-0032928, filed on Mar. 30, 2012, in the Korean Intellectual Property Office, the entire contents of which are hereby incorporated by reference.

BACKGROUND OF THE INVENTION

Example embodiments of inventive concepts relate to a semiconductor device and/or a method of fabricating the same.

Due to their small-sized, multifunctional, and/or low-cost characteristics, semiconductor devices are being regarded as important elements in the electronic industry. Higher integration of semiconductor memory devices satisfies consumer demand for superior performance and inexpensive prices. Increased integration is especially beneficial for semiconductor memory devices, because their integration is an important factor in determining product prices. However, the extremely expensive process equipment used to increase pattern fineness sets a practical limitation on increasing integration for semiconductor memory devices. To overcome such a limitation, a variety of studies have been recently completed on new technology for increasing integration density of the semiconductor memory device.

SUMMARY

Some example embodiments of inventive concepts provide a method of fabricating a semiconductor device, which can prevent mask misalignment from occurring.

Other example embodiments of inventive concepts provide a semiconductor device having improved cell uniformity.

According to some example embodiments of inventive concepts, a method of fabricating a semiconductor device may include patterning a substrate to form a plurality of line-shaped first grooves extending along a first direction and active lines protruding from the substrate to delimit sidewall of the first grooves, forming first device isolation layers to fill the first grooves, forming a plurality of line-shaped first mask patterns extending along a second direction on the substrate, the first and second directions crossing each other, etching the first device isolation layers and the active lines using the first mask patterns as an etch mask to form a plurality of second grooves, removing portions of the active lines exposed by the second grooves and spaced apart from each other to form bar-shaped active portions and first holes therebetween, the removing portions of the active lines exposing sidewalls of the first device isolation layers and extending along the first direction, forming second device isolation layers to fill at least portions of the first holes, and forming word lines in the second grooves.

In some example embodiments, the method may further include recessing portions of the first device isolation layers at bottoms of the second grooves to expose sidewalls of the active lines.

In some example embodiments, the forming of the active portions and the first holes may include conformally forming an etch stop layer on the structure, in which the second grooves may be formed, forming a second mask pattern with second holes on the etch stop layer, the second holes overlapped with the first holes to expose the etch stop layer, performing an anisotropic etching process to form etch stop spacers covering sidewalls of the first mask patterns and the active lines and to expose portions of the active lines at bottoms of the second grooves, and removing the exposed portions of the active lines to form the active portions and the first holes.

In some example embodiments, widths of the second holes may be greater than widths of the active lines, and the removing of the exposed portions of the active lines may include an anisotropic etching process.

In some example embodiments, widths of the second holes may be smaller than that of the active lines, and the removing of the exposed portions of the active lines may include an isotropic etching process.

In some example embodiments, the forming of the active portions and the first holes may include conformally forming an etch stop layer on the entire surface of the structure provided with the second grooves, forming a second mask pattern having second holes on the etch stop layer, the second holes overlapping the first holes to expose the etch stop layer, forming a supplementary spacer to cover sidewalls of the etch stop layer, removing the etch stop layer exposed by the supplementary spacer from a bottom of the second grooves to expose portions of the active lines, and removing the exposed portions of the active lines to form the active portions and the first holes.

In some example embodiments, the forming of the active portions and the first holes may include conformally forming an etch stop layer on the entire surface of the structure provided with the second grooves, forming a second mask pattern having openings on the etch stop layer, the openings overlapping the first hole to expose the etch stop layer, performing an anisotropic etching process to form first spacers covering sidewalls of the first mask patterns and the active lines and to expose portions of the active lines at a bottom of the second grooves, and removing the exposed portions of the active lines to form the active portions and the first holes.

In some example embodiments, the second mask pattern may be formed to have a stepwise shape and to cross both of the active lines and the first mask patterns.

According to some example embodiments of inventive concepts, a semiconductor device may include a substrate, and a word line provided in the substrate to extend along a first direction. The word line has a first width at a first height and a second width at a second height different from the first height, and the first and second widths may be different from each other.

In some example embodiments, the word line has a convex-concave bottom surface.

In some example embodiments, the first height may be higher than the second height and the first width may be greater than the second width.

In some example embodiments, the first height may be higher than the second height and the first width may be smaller than the second width.

In some example embodiments, the device may further include a plurality of line-shaped first device isolation layers extending along a second direction crossing the first direction, and a second device isolation layer between the first device isolation layers and adjacent to a bottom surface of the word line.

In some example embodiments, a bottom surface of the second device isolation layer may be rounded.

According to some example embodiments of inventive concepts, a method of fabricating a semiconductor device may include forming word lines in a first direction on a substrate, wherein the word lines have first widths at a first height and second widths at a second height different from the first height, and the first and second widths are different from each other.

In some example embodiments, the method may include forming first device isolation layers to at least partially fill a plurality of line-shaped first grooves, the first grooves extending along a second direction, active lines protruding from the substrate to delimit sidewalls of the first grooves; forming a plurality of second grooves along the first direction, the first direction and second direction crossing each other; forming first holes in the second grooves; and forming second device isolation layers to at least partially fill the first holes, wherein the forming word lines forms the word lines in the second grooves and the first holes.

In some example embodiments, the method may include removing portions of the first device isolation layers exposed by the second grooves to form first recessed regions exposing sidewalls of the active lines; and removing portions of the active lines exposed by the second grooves and spaced apart from each other to form bar-shaped active portions and the first holes therebetween, the removing portions of the active lines extending along the second direction and exposing sidewalls of the first device isolation layers.

In some example embodiments, the forming of the active portions and the first holes may include conformally forming an etch stop layer on the first device isolation layers and the active lines, the second grooves being formed in the etch stop layer; forming a mask pattern with second holes on the etch stop layer, the second holes overlapping the first holes to expose the etch stop layer; performing an anisotropic etching process to form an etch stop spacer covering sidewalls of the active lines and to expose portions of the active lines at bottoms of the second grooves; and removing the exposed portions of the active lines to form the active portions and the first holes.

In some example embodiments, widths of the second holes are greater than that of the active lines, and the removing of the active lines includes an anisotropic etching process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
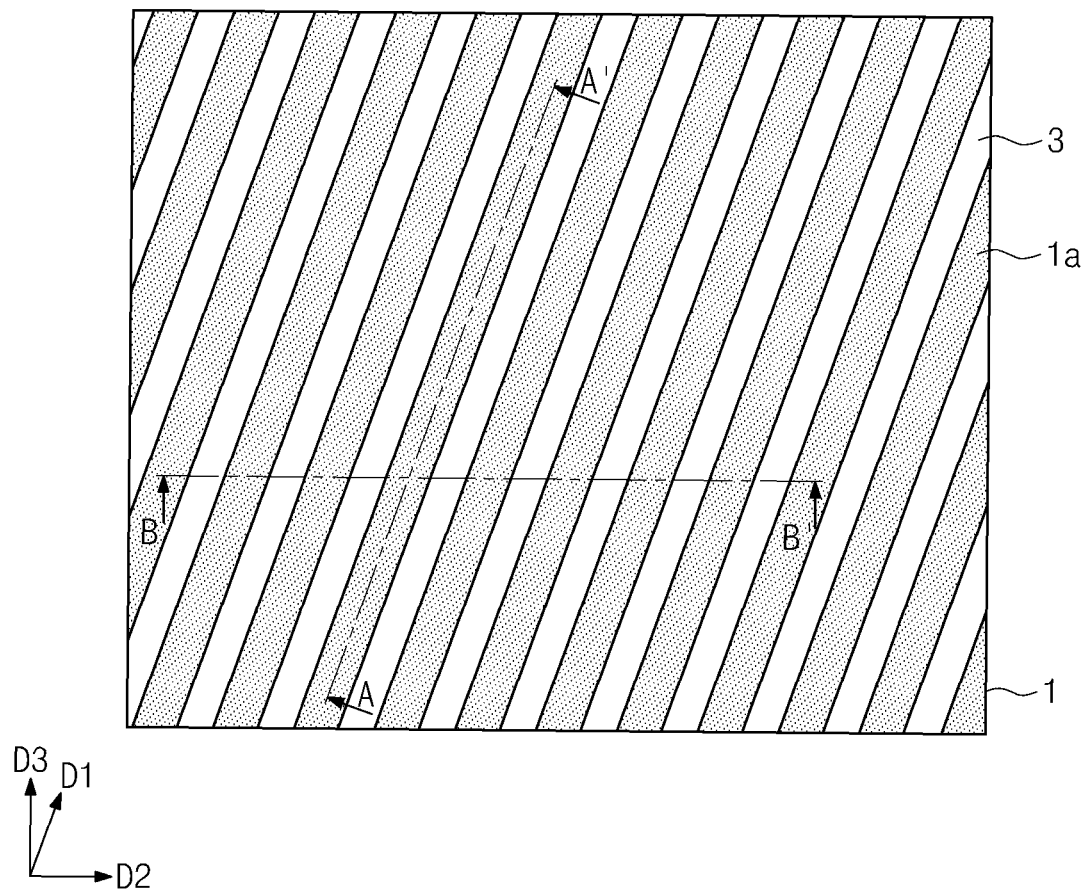
FIGS. 1A, 2A, 3A, 4A, 7A, 8A, 9A, and 10A are plan views illustrating a process of fabricating a semiconductor device according to a first example embodiment of inventive concepts.
Figure 1B:
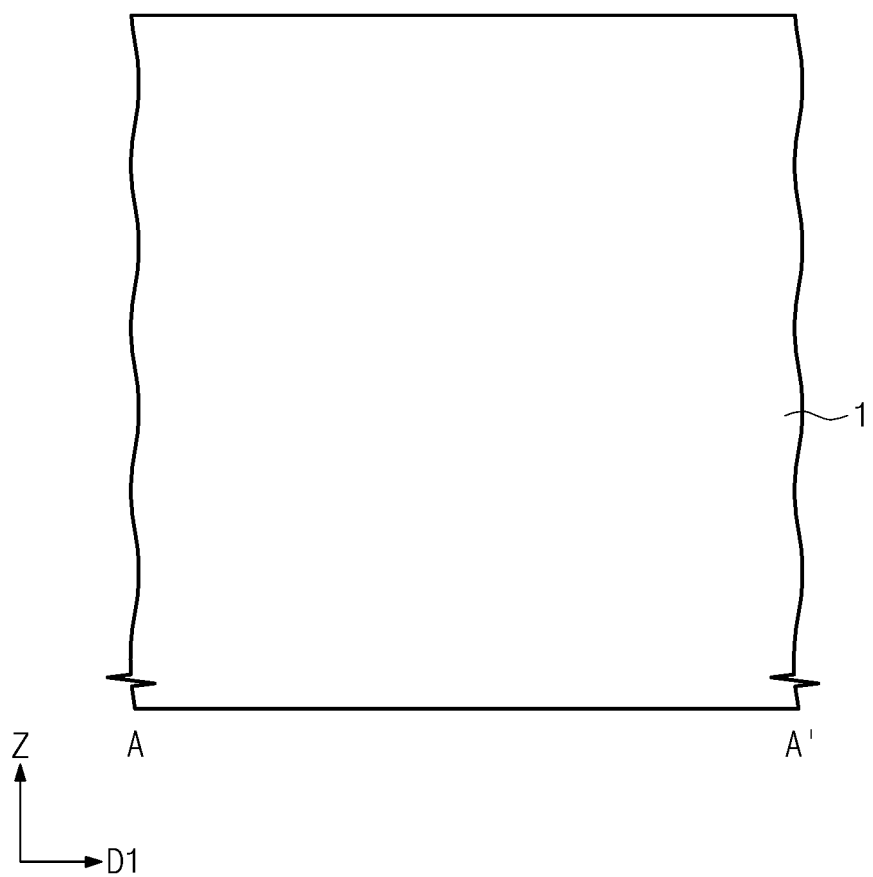
FIGS. 1B 2B, 3B, 4B, 7B, 8B, 9B and 10B are sectional views taken along a line A-A' of FIGS. 1A-4A and 7A-10A, respectively.
Figure 1C:
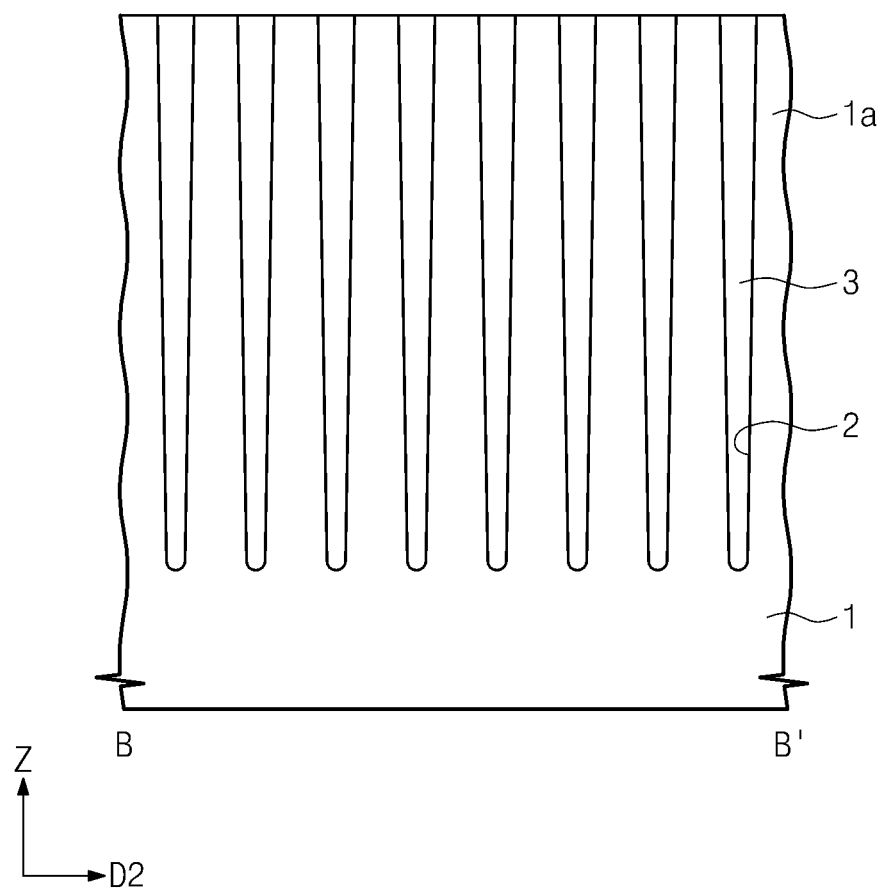
FIGS. 1C, 2C, 3C, 4C, 7C, 8C, 9C and 10C are sectional views taken along a line B-B' of FIGS. 1A-4A and 7A-10A, respectively.
Figure 1D:
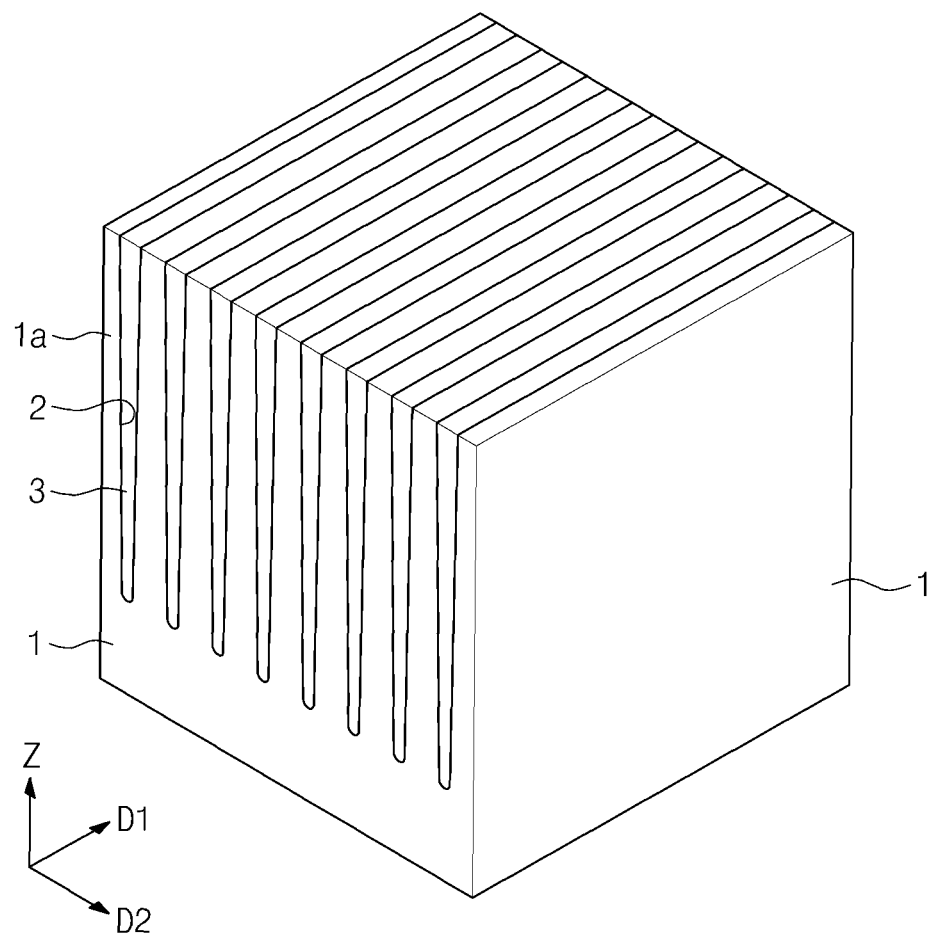
FIGS. 1D, 2D, 3D, 4D, 7D, 8D, and 9D are perspective views illustrating the fabricating process according to the first example embodiment of inventive concepts.
Figure 2A:
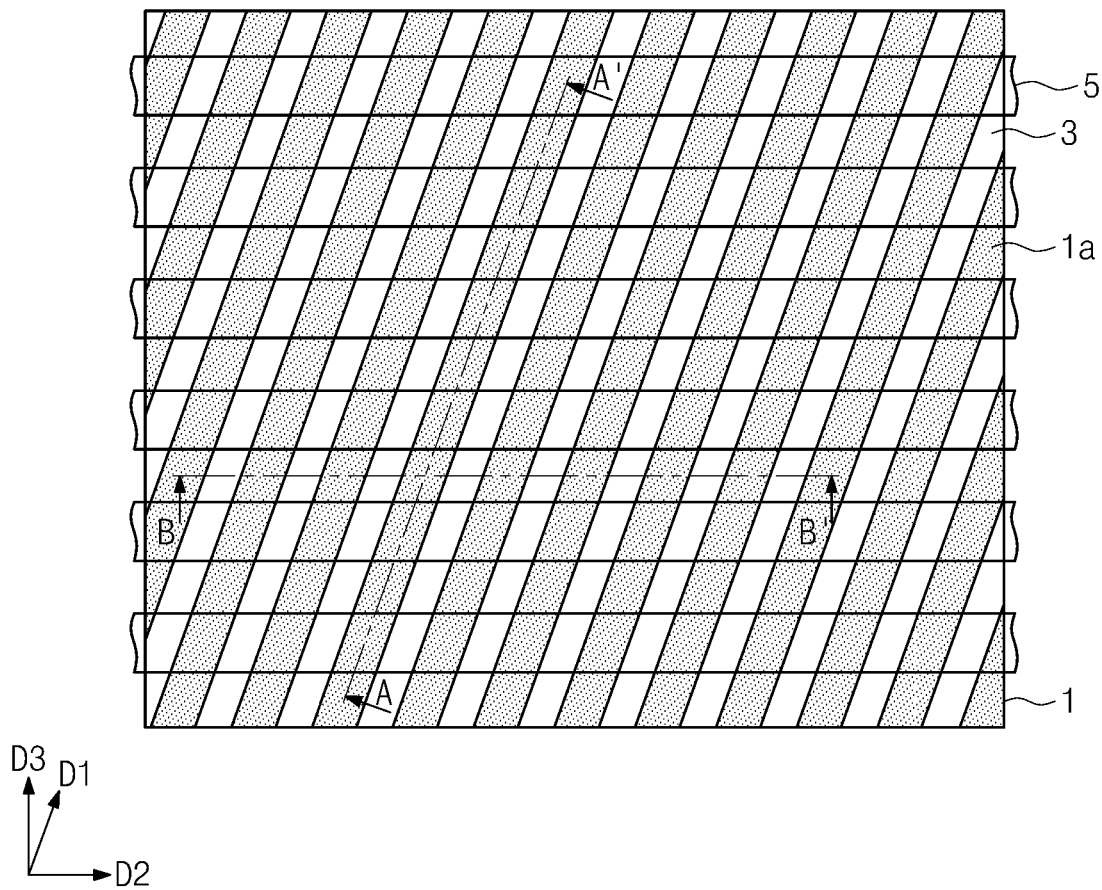
Figure 2B:
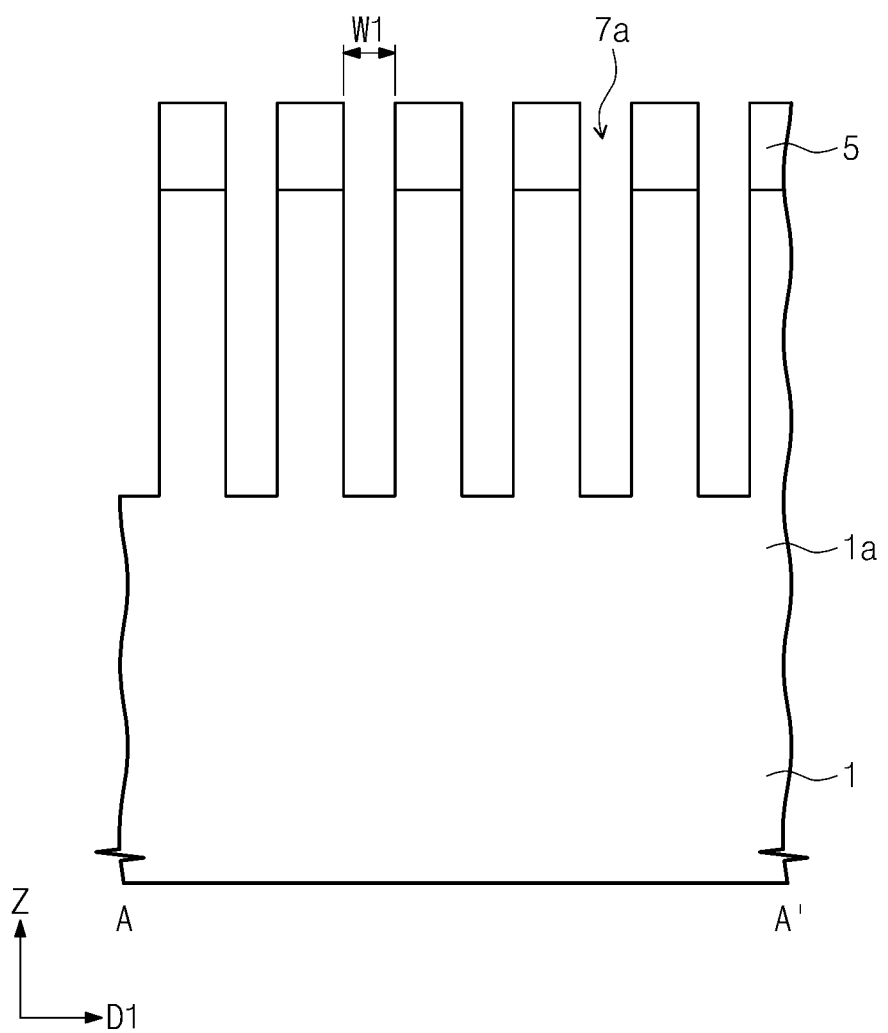
Figure 2C:
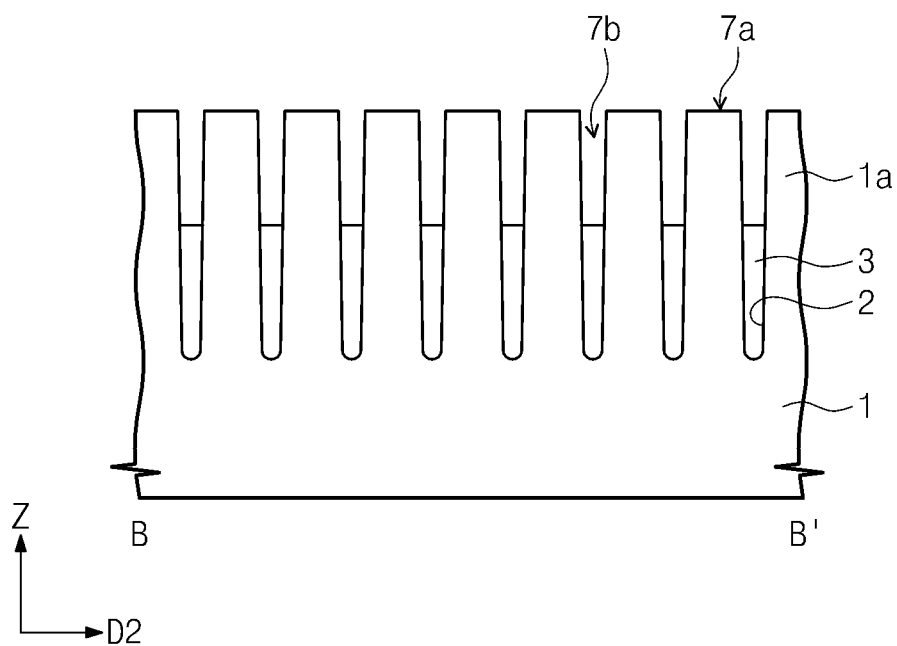
Figure 2D:
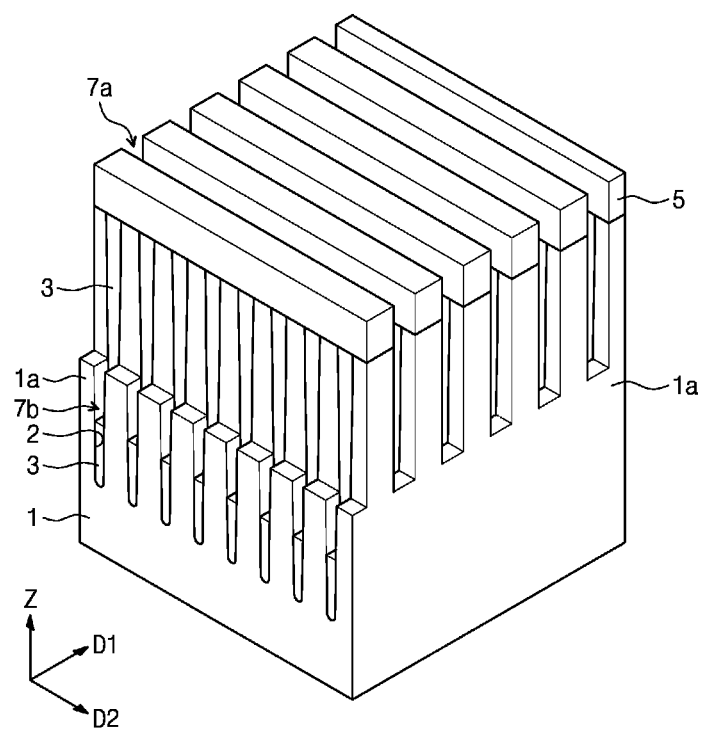

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown. Example embodiments of inventive concepts may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of some example embodiments and intermediate structures. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First Example Embodiment

FIGS. 1A-4A and 7A-10A are plan views illustrating a process of fabricating a semiconductor device according to a first example embodiment of inventive concepts. FIGS. 1B-4B and 7B-10B are sectional views taken along a line A-A' of FIGS. 1A-4A and 7A-10A, respectively, and FIGS. 1C-4C and 7C-10C are sectional views taken along a line B-B' of FIGS. 1A-4A and 7A-10A, respectively. FIGS. 1D-4D and 7D-9D are perspective views illustrating the fabricating process according to the first example embodiment of inventive concepts. FIGS. 5A and 6A are sectional views illustrating, in more detail, some steps of the fabricating process, which are performed between the steps of FIGS. 4B and 7B, and FIGS. 5B and 6B are sectional views illustrating, in more detail, some steps of the fabricating process, which are performed between the steps of FIGS. 4C and 7C. FIGS. 5C and 6C are perspective views illustrating, in more detail, some steps of the fabricating process, which are performed between the steps of FIGS. 4D and 7D.

Referring to FIGS. 1A, 1B, 1C and 1D, a substrate 1 may be patterned to form a plurality of first grooves 2, each of which is shaped like a line. The first grooves 2 may extend parallel to each other along a first direction D1 and define a plurality of active lines 1a protruding from the substrate 1. The substrate 1 may be one of a single crystalline silicon wafer, a substrate including an epitaxially grown silicon layer or a silicon-on-insulator (SOI) wafer. First device isolation layers 3 may be formed in the first grooves 2. The first device isolation layers 3 may be formed using shallow trench isolation (STI) techniques. The first device isolation layers 3 may include at least one of a silicon oxide layer, a silicon nitride layer, and a silicon oxynitride layer. The first device isolation layers 3 may extend parallel to each other along the first direction D1, and, from a plan view, each of them may be shaped like a line.

Referring to FIGS. 2A 2B, 2C and 2D, first mask patterns 5 may be formed on the substrate 1 to extend parallel to each other along a second direction D2 crossing the first direction D1. Each of the first mask patterns 5 may be shaped like a line. From a plan view, the first mask patterns 5 may be used to define shapes of word lines. The first mask patterns 5 may be formed of for example, at least one of metal oxides, an amorphous carbon layer (ACL), and a spin-on-hardmask (SOH) layer. The first device isolation layer 3 and the active lines 1a may be etched using the first mask patterns 5 as an etch mask to form second grooves 7a extending parallel to each other along the second direction D2. Each of the second grooves 7a may be formed to have a first width W1. In some example embodiments, the second grooves 7a may be formed to have a depth shallower than that of each first groove 2. As a result, the active lines 1a may remain below the second grooves 7a. After the formation of the second grooves 7a, the first device isolation layer 3 exposed by the second grooves 7a may be partially removed to form first recessed regions 7b exposing sidewalls of the active lines 1a. The first recessed regions 7b may be formed by removing a portion of the first device isolation layer 3 overlapped with the first grooves 2.

Referring to FIGS. 3A, 3B, 3C and 3D, a first etch stop layer 9, a second etch stop layer 11, a second mask layer 13, and a third mask layer 15 may be sequentially stacked on the substrate 1. The first etch stop layer 9 may be formed of, for example, a silicon nitride layer, and the second etch stop layer 11 may be formed of, for example, a silicon oxide layer. The second mask layer 13 may be formed of, for example, a silicon nitride layer, and the third mask layer 15 may be formed of, for example, an amorphous carbon layer. The first etch stop layer 9 may be formed to fill the first recessed region 7*b*. The first and second etch stop layers 9 and 11 may be formed to cover conformally sidewalls of the second grooves 7*a*.

Referring to FIGS. 4A, 4B, 4C and 4D, the third mask layer 15 and the second mask layer 13 may be sequentially etched to form first holes 17. (Hereinafter, the third mask layer 15 and the second mask layer 13 may be referred as to a third mask pattern 15 and a second mask pattern 13, respectively.) From a plan view, the first holes 17 may be formed at some of intersections between the second grooves 7*a* and the active lines 1*a*. For example, two second grooves 7*a* may be formed between each pair of the first holes 17 adjacent to each other along the first direction D1. Two active lines 1*a* may be formed between the first holes 17 adjacent to each other along the second direction D2. During the etching of the first holes 17, the second etch stop layer 11 may serve as an etch stop layer. Thereafter, the second etch stop layer 11 exposed by the first holes 17 may be etched to expose the first etch stop layer 9.

Figure 5A:
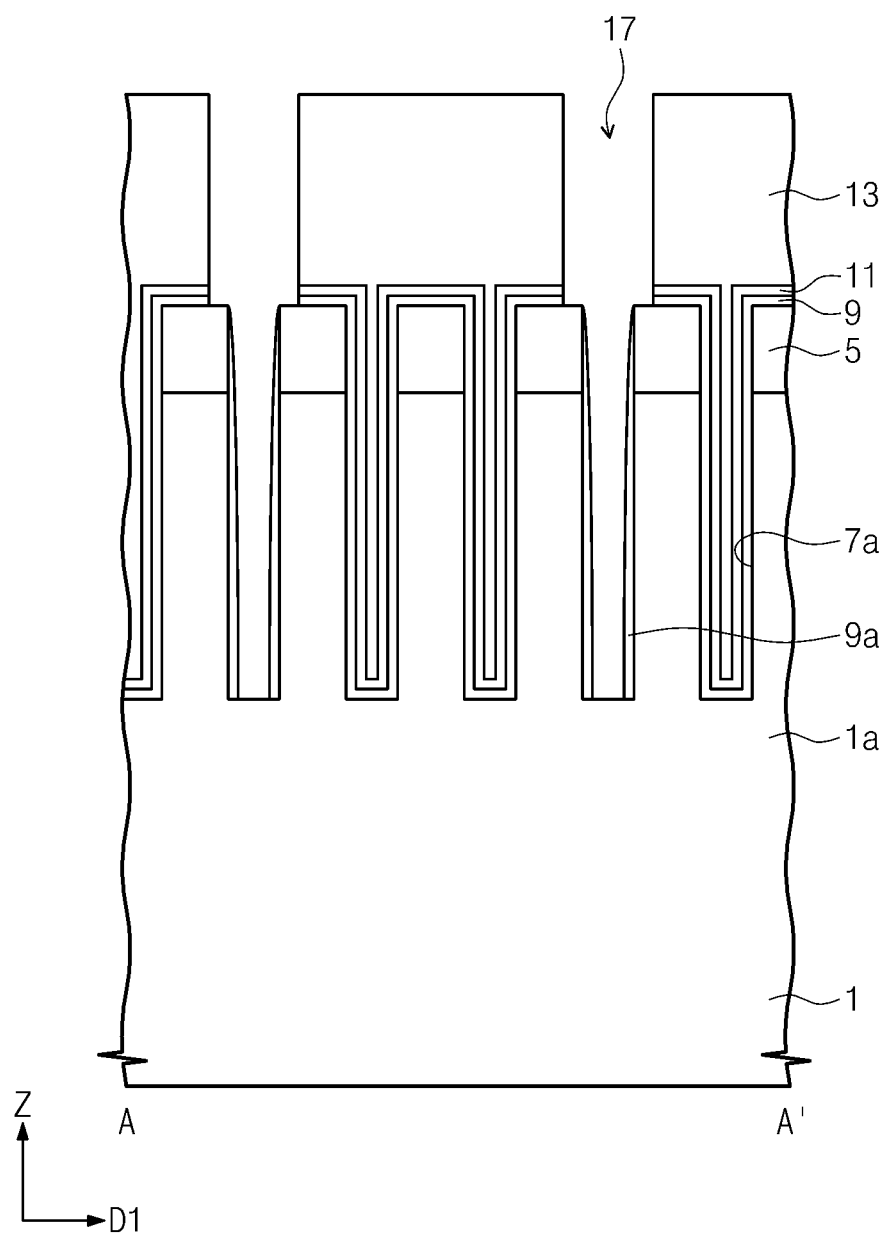
FIGS. 5A and 6A are sectional views illustrating, in more detail, some steps of the fabricating process, which are performed between the steps of FIGS. 4B and 7B.
Figure 5B:
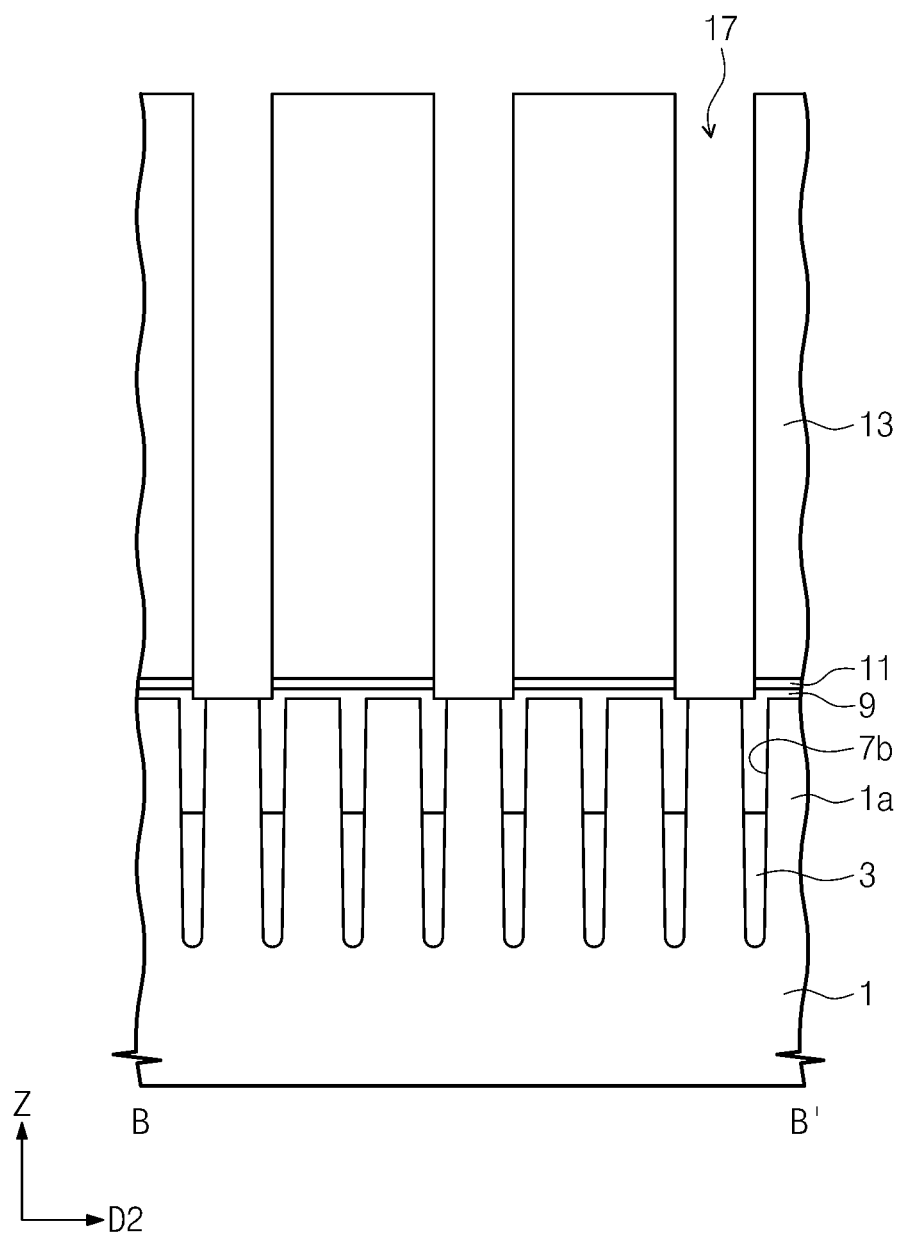
FIGS. 5B and 6B are sectional views illustrating, in more detail, some steps of the fabricating process, which are performed between the steps of FIGS. 4C and 7C.
Figure 5C:
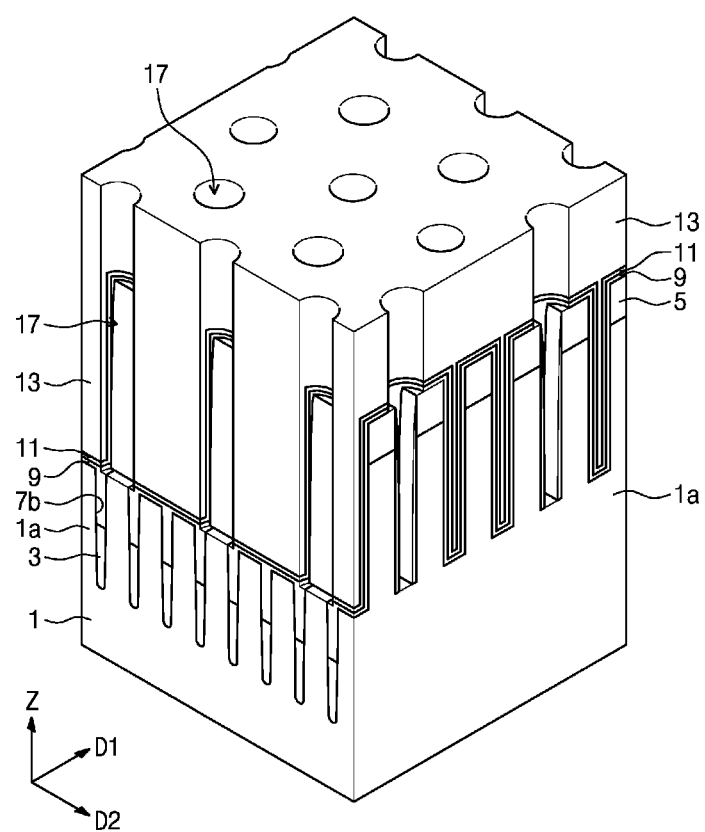
FIGS. 5C and 6C are perspective views illustrating, in more detail, some steps of the fabricating process, which are performed between the steps of FIGS. 4D and 7D.
Figure 6A:
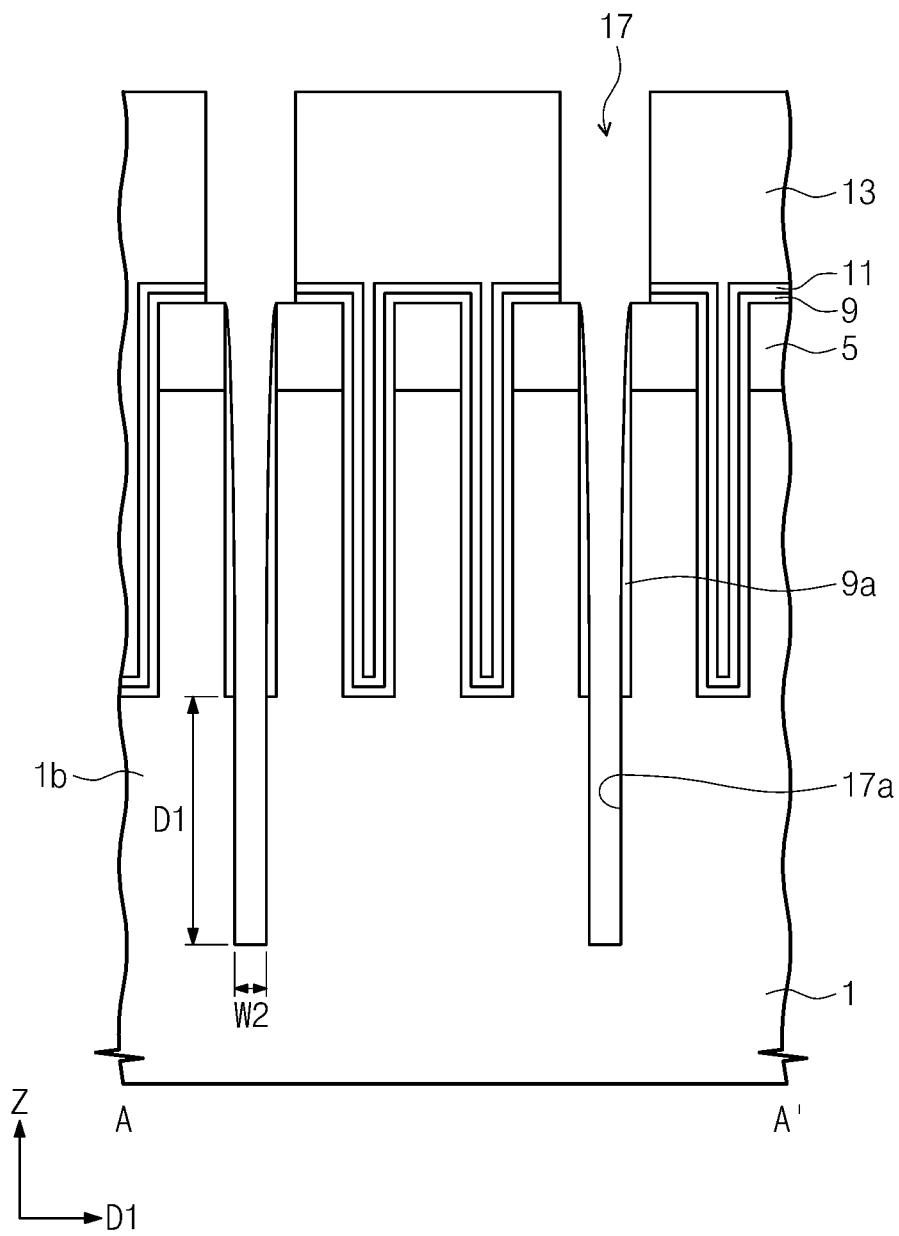

Referring to FIGS. 5A, 5B, and 5C, the third mask pattern 15 may be removed. In some example embodiments, the third mask pattern 15 may be removed during the step of etching the second etch stop layer 11. A remaining portion of the third mask pattern 15 may be removed by an additional etching step. For example, the removal of the third mask pattern 15 may be performed using an ashing process. The first etch stop layer 9 exposed by the first holes 17 may be etched by an anisotropic etching process. The second mask pattern 13 may serve as an etch mask. Alternatively, the third mask pattern 15 may remain on the second mask pattern 13 and serve as an etch mask when the first etch stop layer 9 is anisotropically etched. Accordingly, the active lines 1*a* may be exposed by bottom surfaces of the second grooves 7*a*, and an etch stop spacer 9*a* may be formed to cover sidewalls of the active lines 1*a* and the first mask pattern 5 provided at regions overlapped with the first holes 17. The etch stop spacer 9*a* may be formed to expose a top surface of the first mask pattern 5. A width of each first hole 17 may be formed to be greater than that of the second grooves 7*a*. Even if the third mask pattern 15 remains before the anisotropic etching process, the third mask pattern 15 may be completely removed during the anisotropic etching process. After the formation of the etch stop spacer 9*a*, the third mask pattern 15 may be completely removed to expose the second mask pattern 13.

Figure 6B:
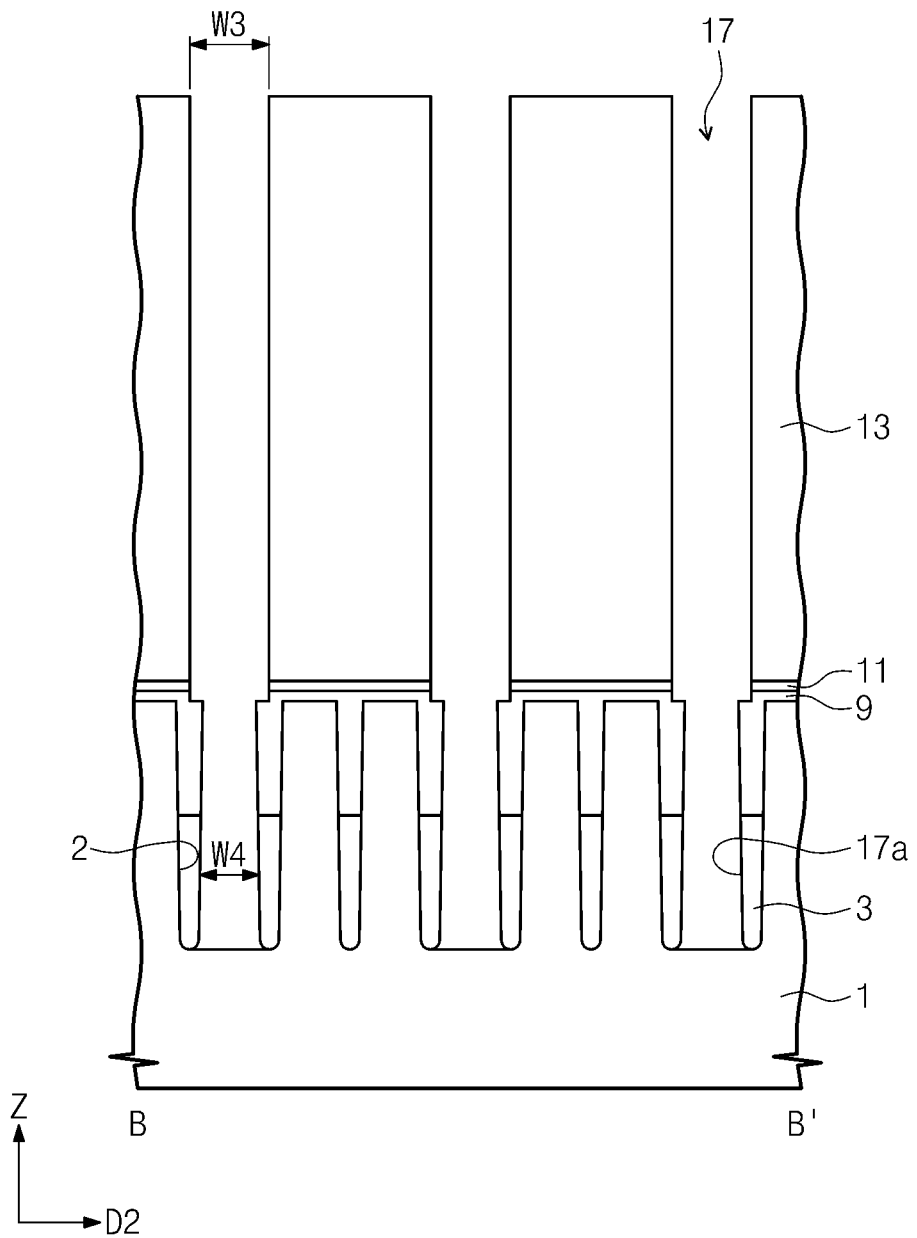
Figure 6C:
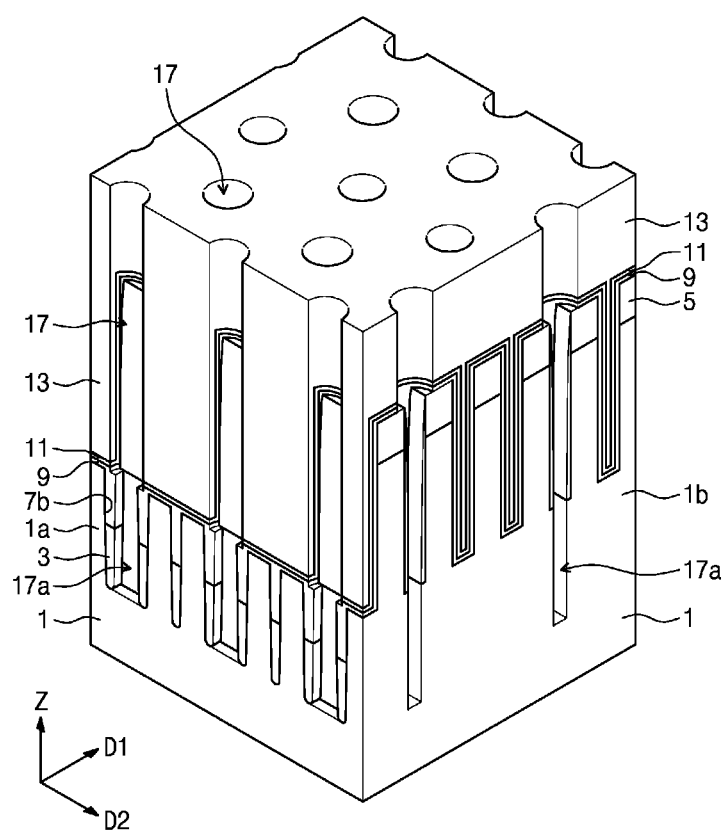
Figure 7A:
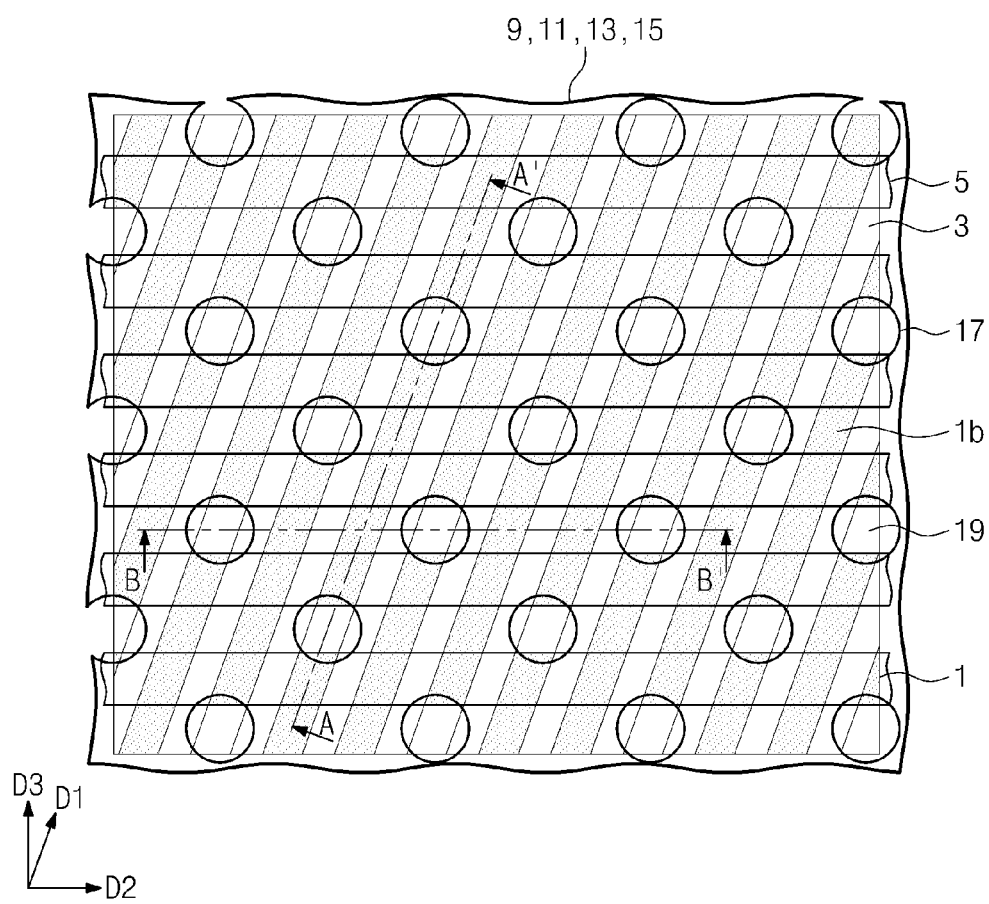
Figure 7B:
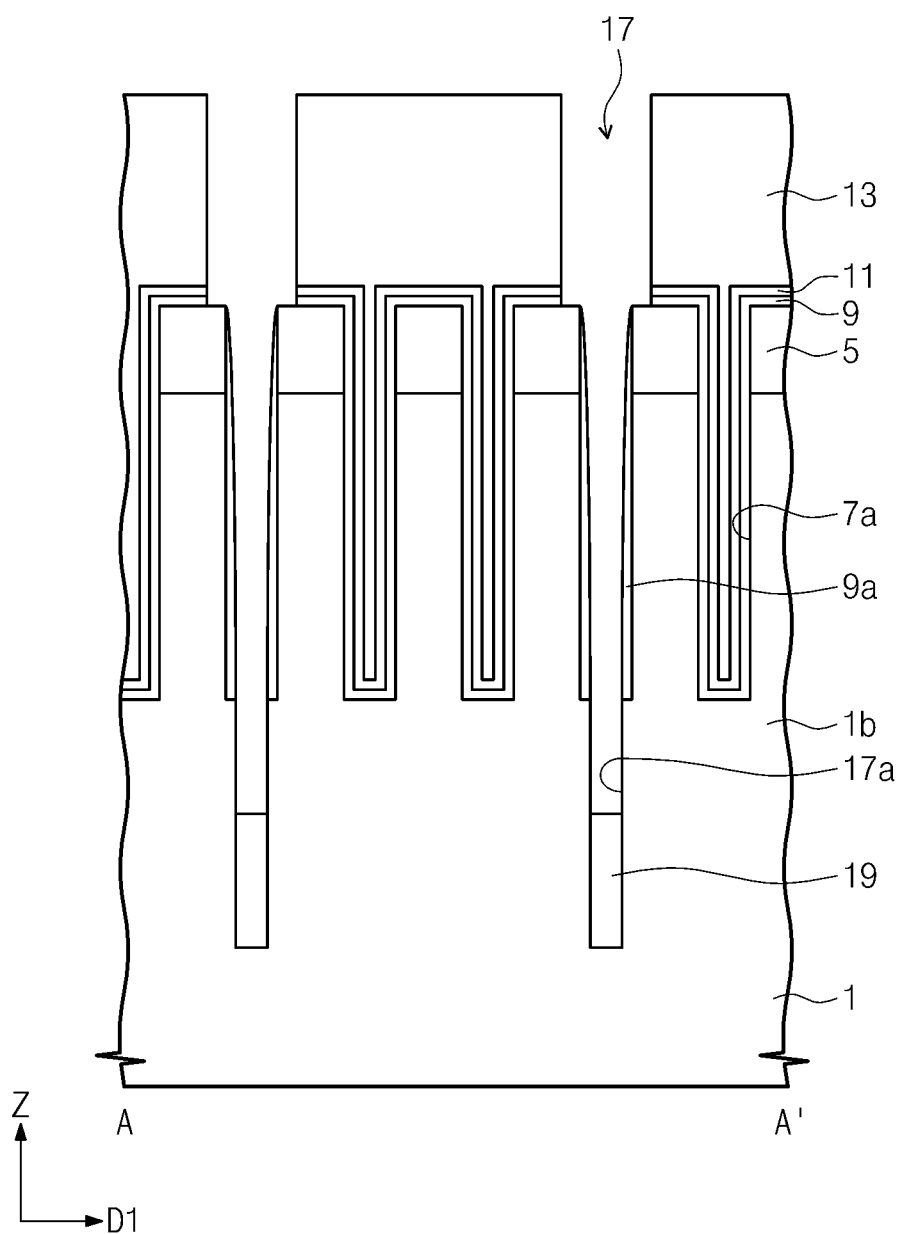
Figure 7C:
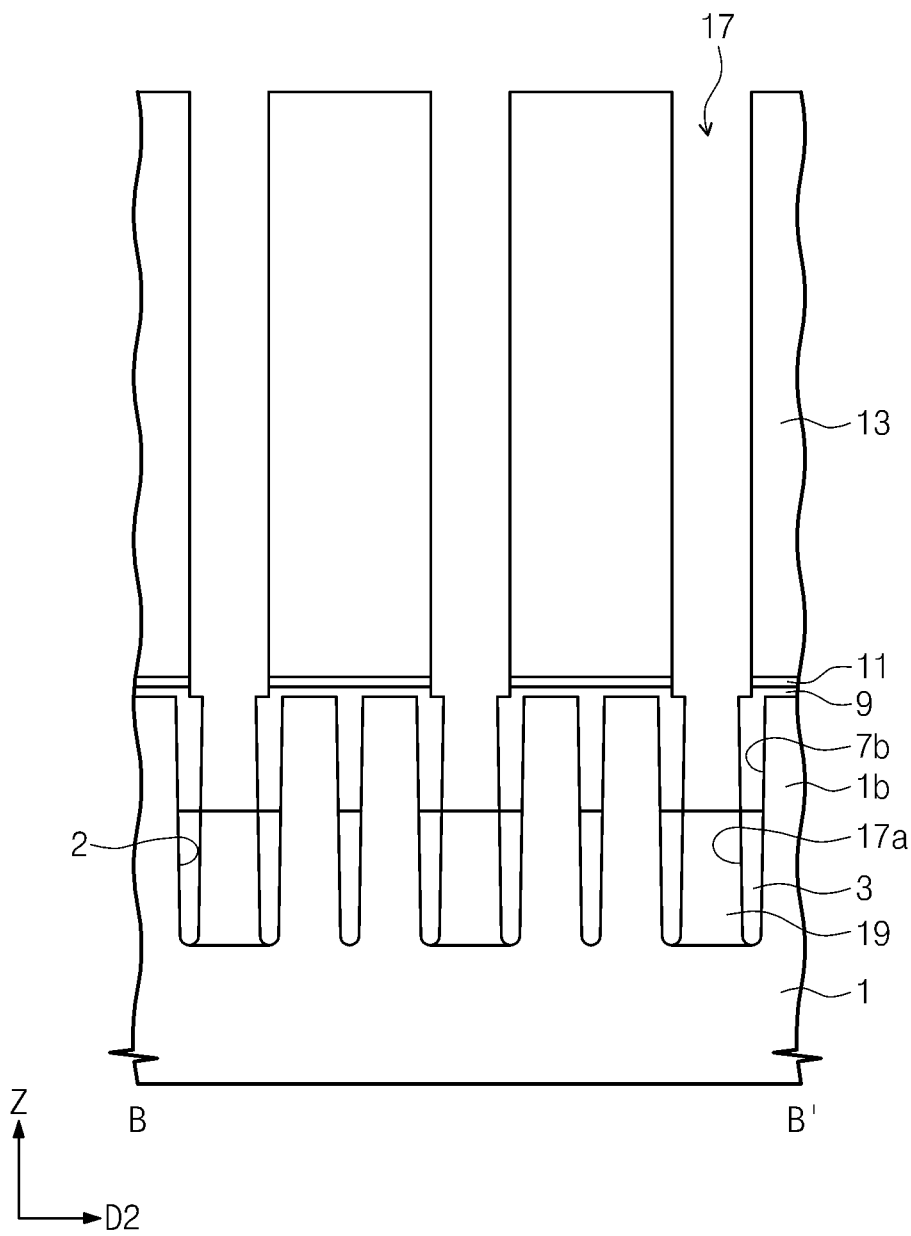
Figure 7D:
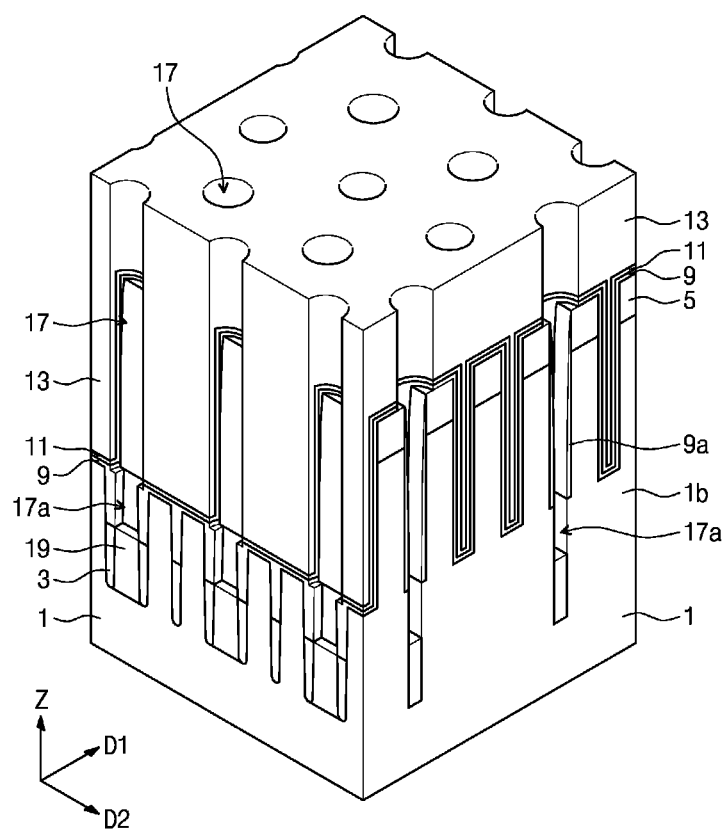
Figure 8A:
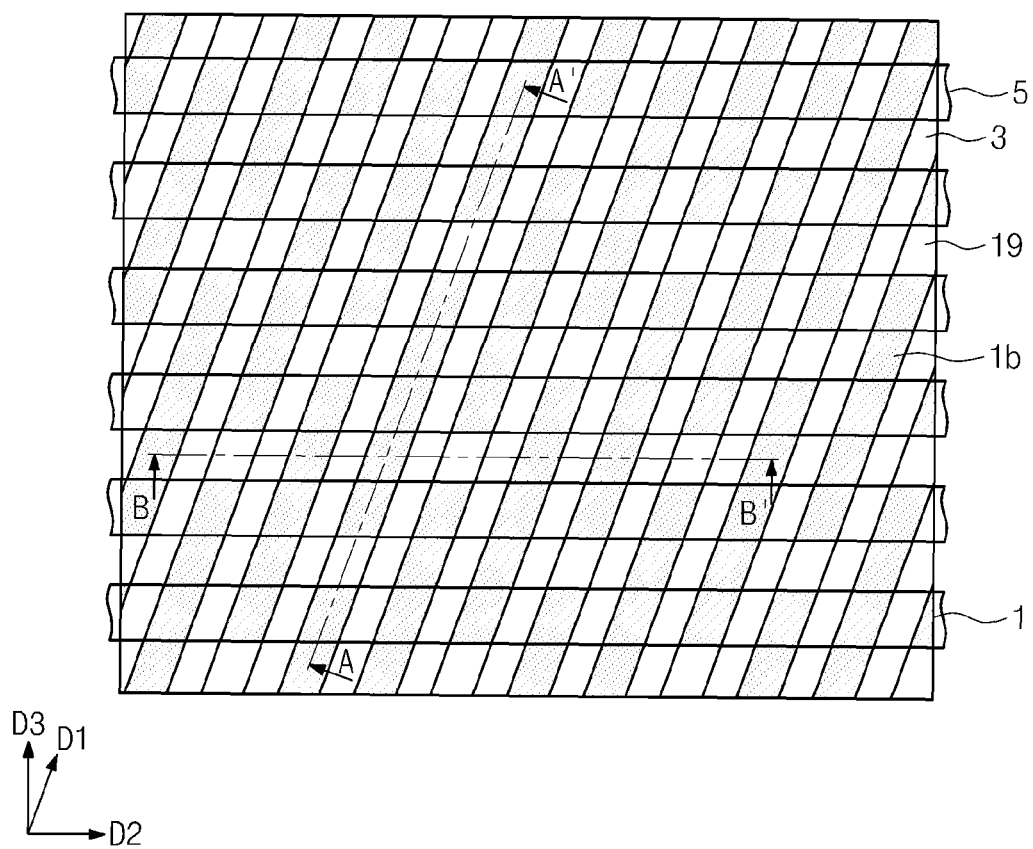
Figure 8B:
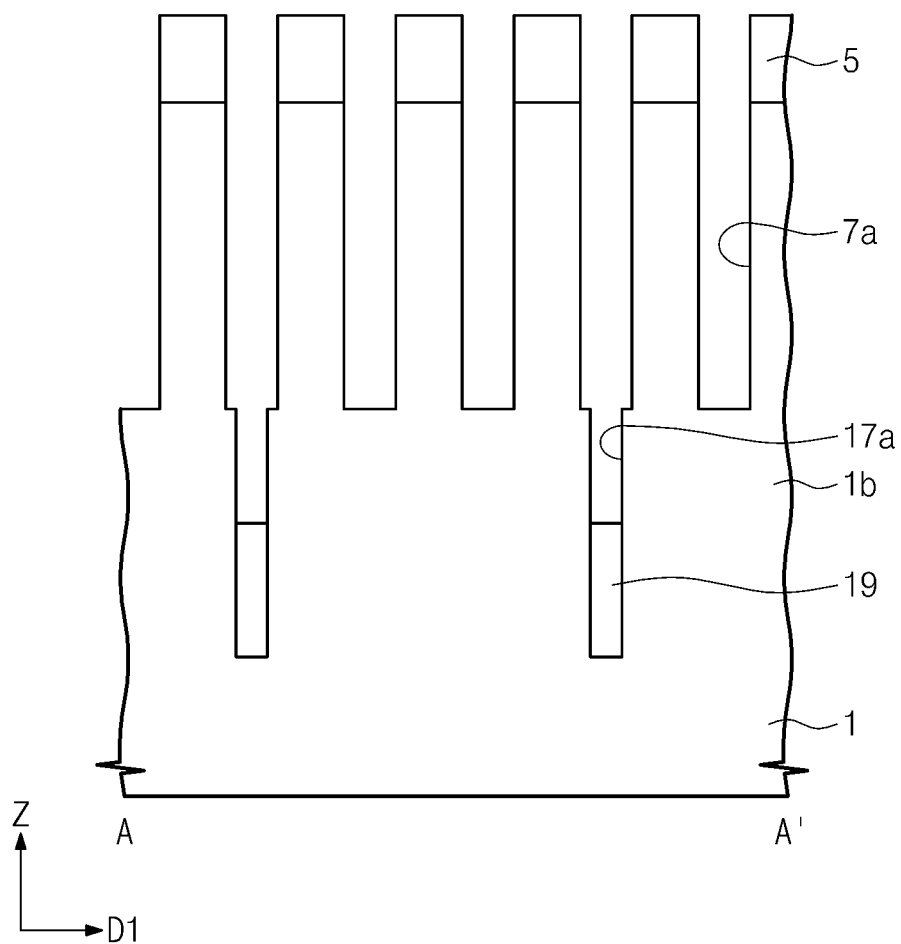
Figure 8C:
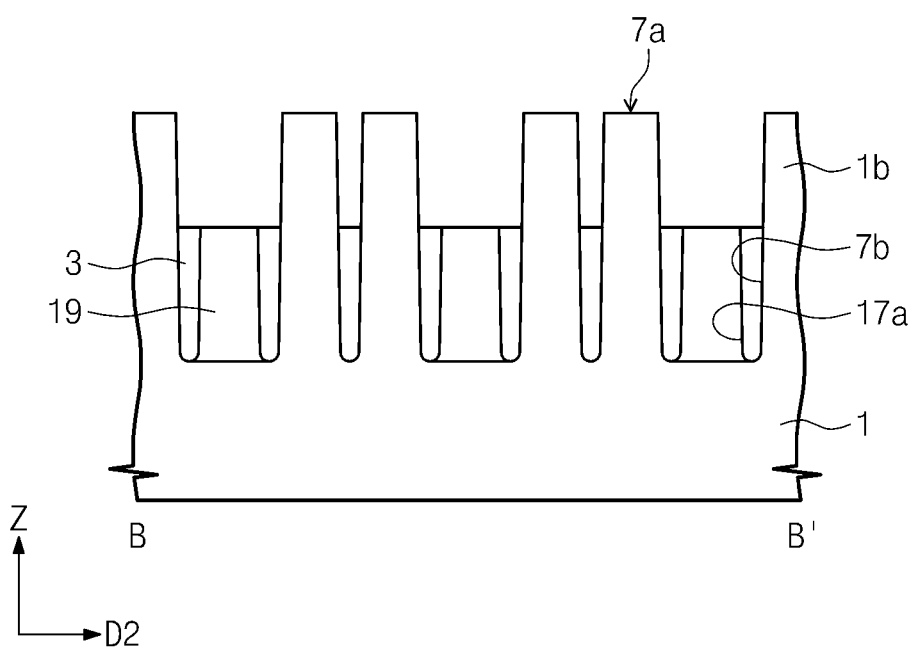
Figure 8D:
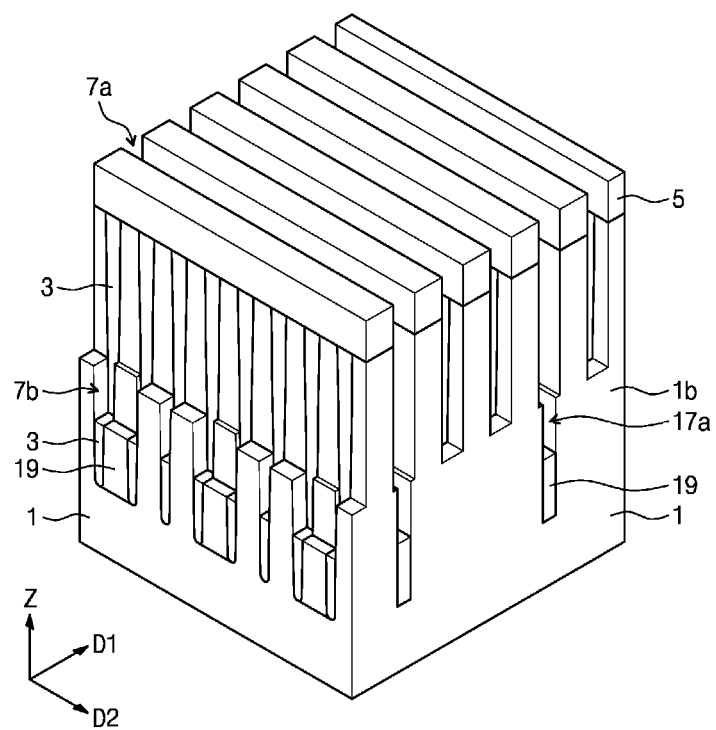
Figure 9A:
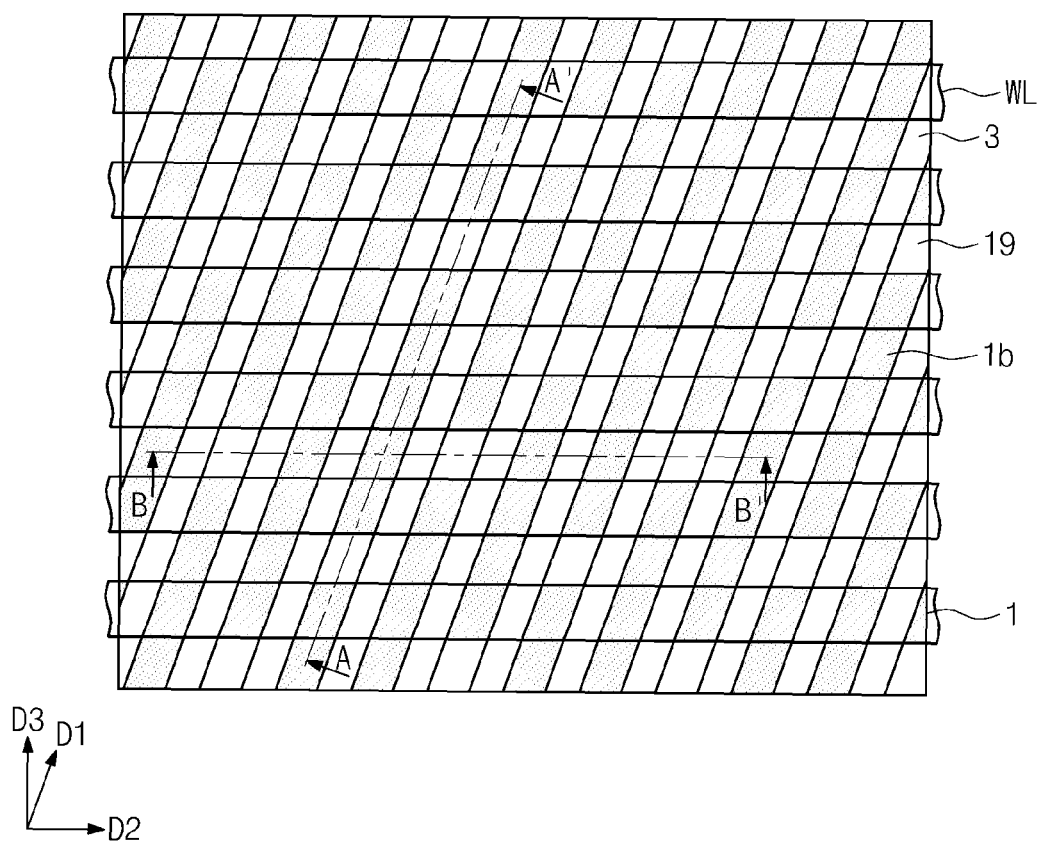
Figure 9B:
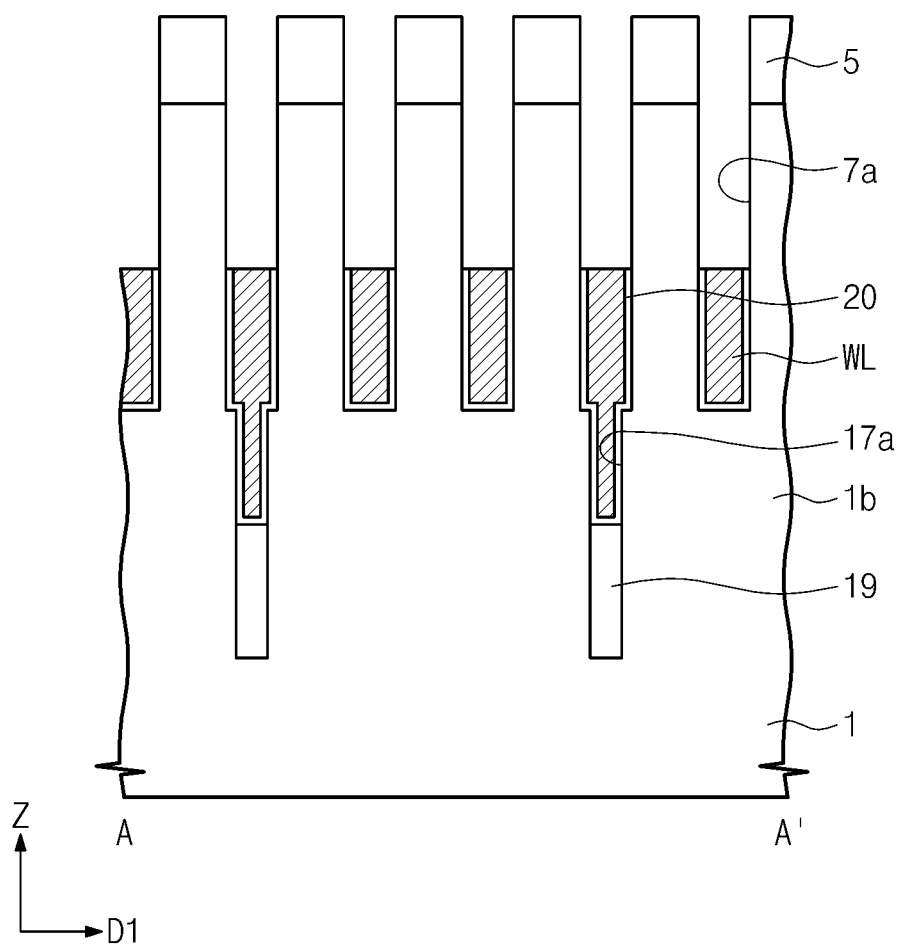
Figure 9C:
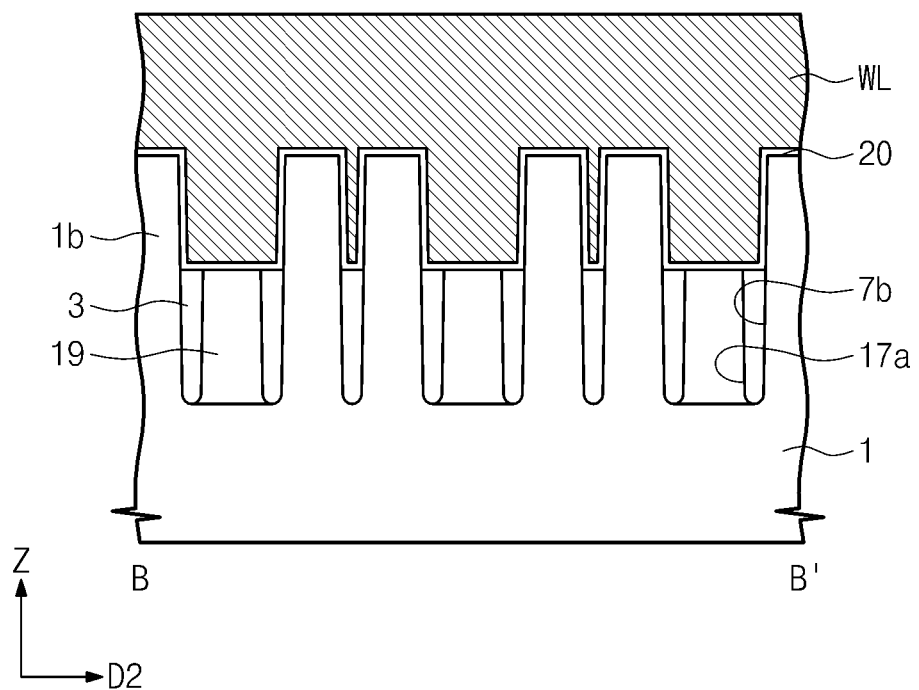
Figure 9D:
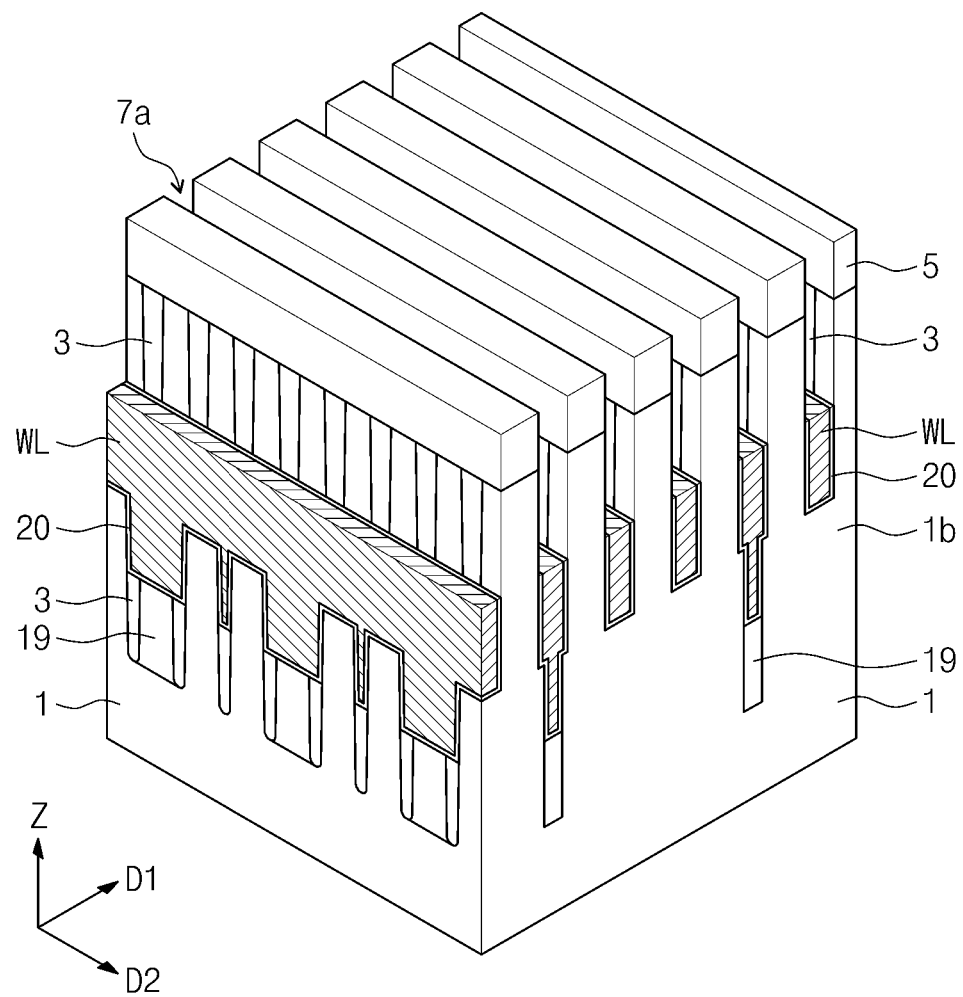

Referring to FIGS. 6A 6B and 6C, the active lines 1*a* exposed by the first holes 17 may be etched to form second holes 17*a* and active portions 1*b*. The second holes 17*a* may be formed to have a first depth D1 from a bottom surface of the second grooves 7*a*, and each of the active portions 1*b* may be shaped like a bar elongated in the first direction D1. In some example embodiments, a depth of a bottom surface of the second hole 17*a* may be substantially equal to that of the first groove 2. A lower sidewall of the first device isolation layer 3 may be exposed by the second hole 17*a*. In addition, a sidewall of the first etch stop layer 9 may be exposed in the first recessed region 7*b*. A width W4 of the second hole 17*a* may be smaller than a width W3 of the first holes 17, when measured along the second direction D2. Due to the presence of the etch stop spacer 9*a*, a width W2 of the second hole 17*a*, parallel to the first direction D1, may be smaller than a width W1 of the second grooves 7*a*.

Referring to FIGS. 7A, 7B, 7C and 7D, an insulating layer may be deposited on the substrate 1 and be recessed to form a second device isolation layer 19 filling a lower portion of the second hole 17*a*. The second device isolation layer 19 may be formed of, for example, a silicon oxide layer. In some example embodiments, a top surface of the second device isolation layer 19 may be substantially coplanar with a top surface of the first device isolation layer 3 in the first recessed region 7*b*. A bottom surface of the second device isolation layer 19 may be substantially coplanar with a bottom surface of the first device isolation layer 3. Accordingly, the active portions 1*b* may be defined by the first device isolation layer 3 and the second device isolation layer 19.

Referring to FIGS. 8A, 8B, 8C and 8D, the second mask pattern 13, the second etch stop layer 11, the first etch stop layer 9, and the etch stop spacer 9*a* may be removed to expose the first mask pattern 5, the active portions 1*b*, the first device isolation layer 3, and the second device isolation layer 19 defining the second grooves 7*a*.

Referring to FIGS. 9A, 9B, 9C and 9D, a gate insulating layer 20 may be conformally formed on the substrate 1. The gate insulating layer 20 may be formed by oxidizing exposed surfaces of the active portions 1*b* or depositing an oxide layer. Thereafter, a conductive layer may be formed to fill the second grooves 7*a* and be recessed to form word lines WL in the second grooves 7*a*. The word lines WL may be formed of, for example, at least one of a doped polysilicon layer, a metal silicide layer, or a metal-containing layer. The word line WL may be formed to have a top surface lower than a bottom surface of the first mask pattern 5.

Figure 10A:
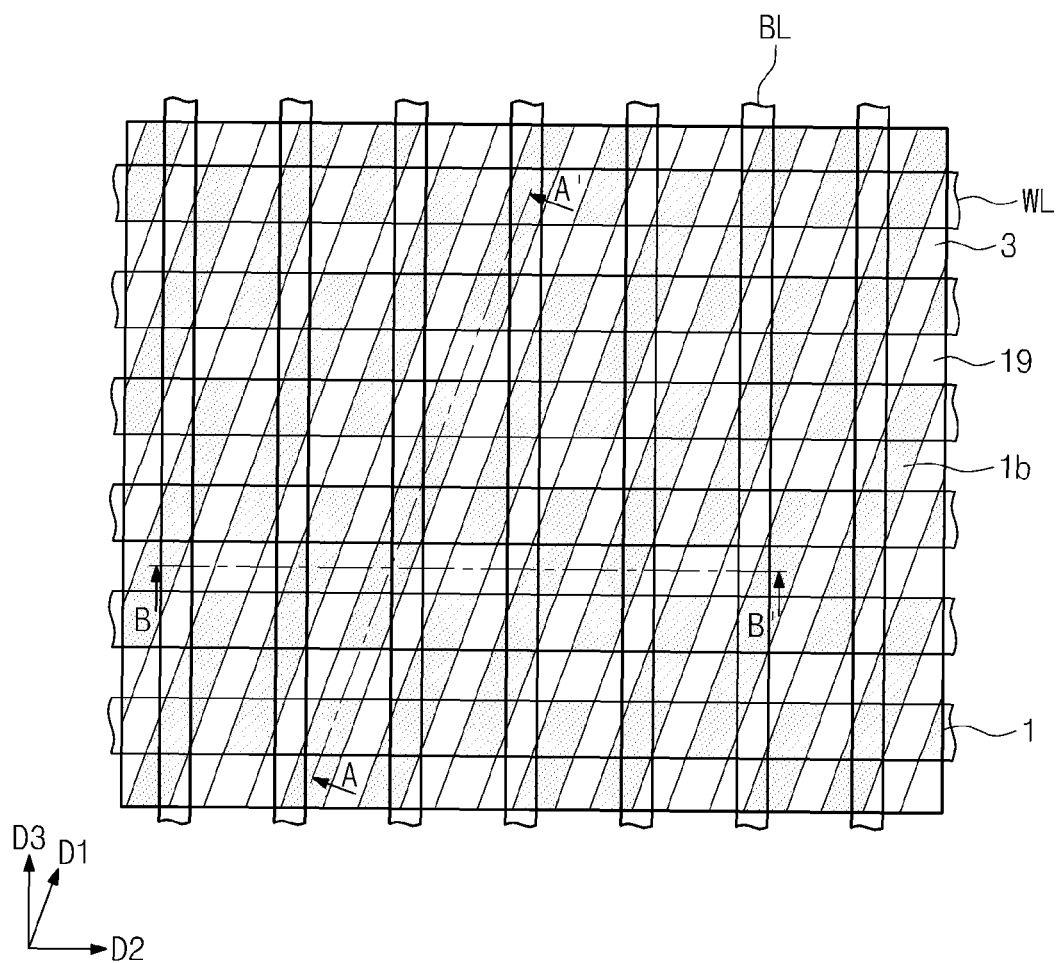
Figure 10B:
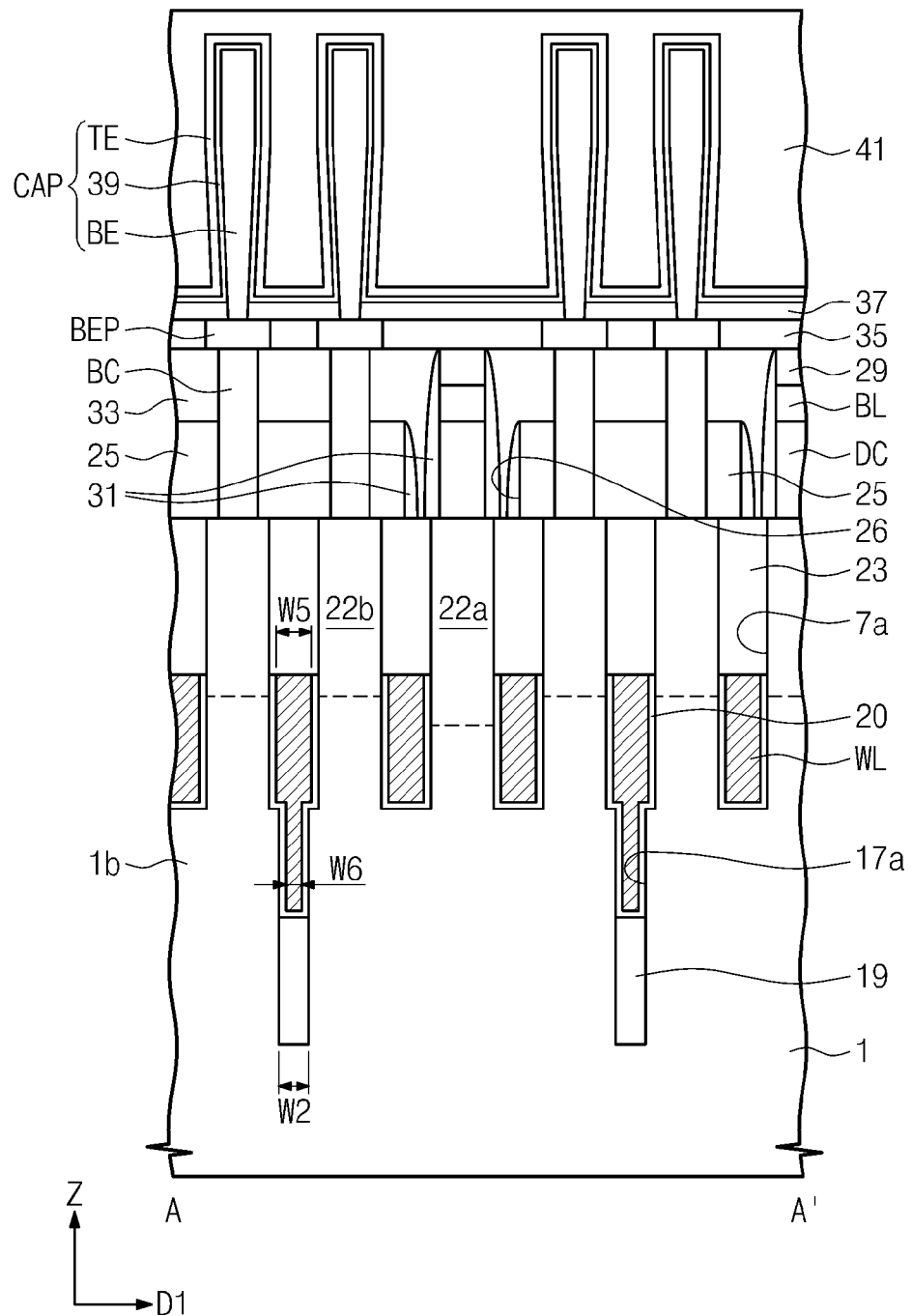
Figure 10C:
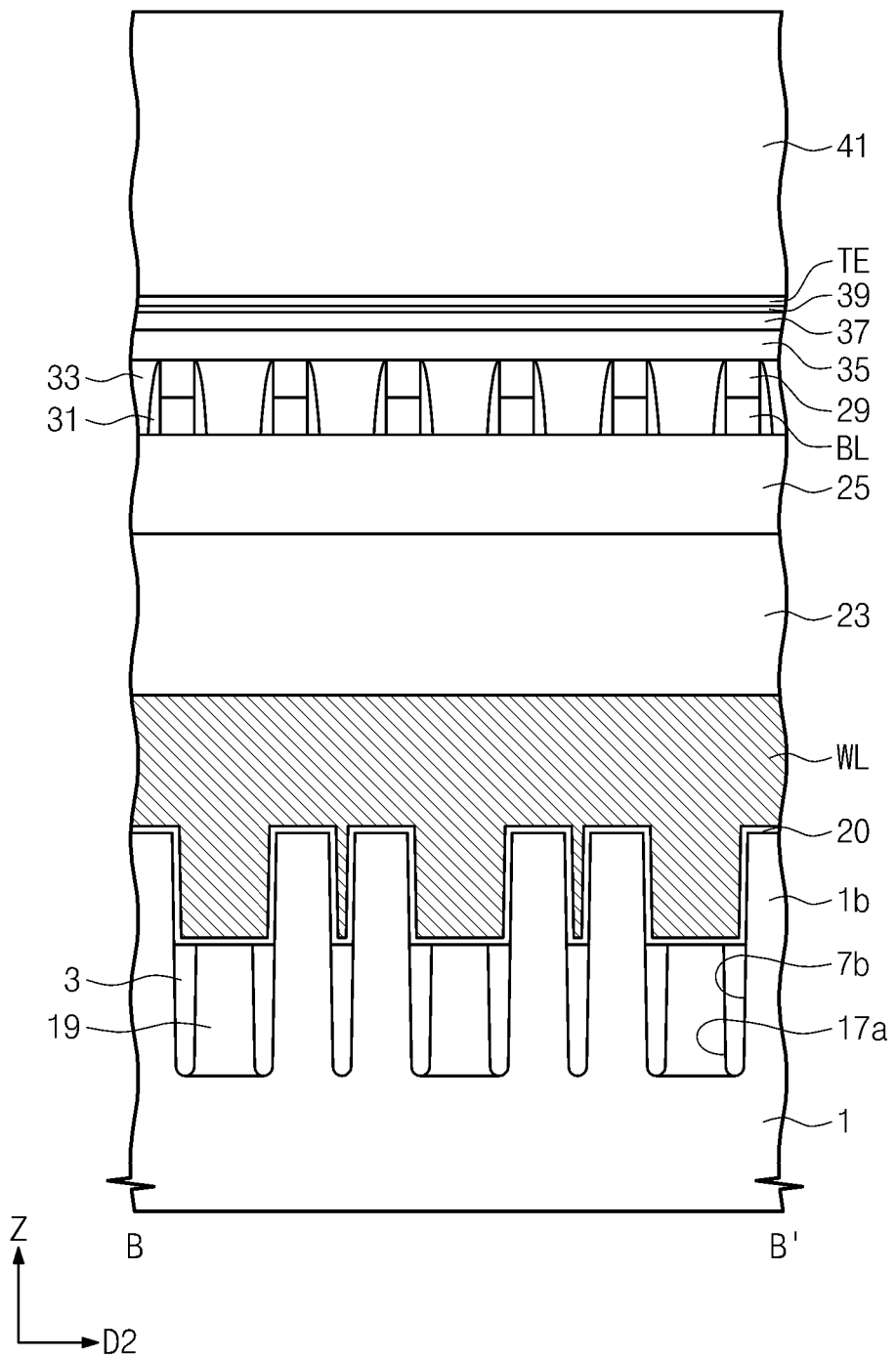

Referring to FIGS. 10A, 10B and 10C, a first capping layer pattern 23 may be formed on the word lines WL. The first capping layer pattern 23 may fill the second groove 7*a*. The first mask pattern 5 may be removed. An ion implantation process may be performed to form a first doped region 22*a* and a second doped region 22*b* in each of the active portions 1*b*. A first interlayered insulating layer 25 may be formed on the substrate 1 and be patterned to form a bit line node hole 26. A bit line node contact DC may be connected to the first doped region 22*a* through the bit line node hole 26. A plurality of bit lines BL may be formed on the first interlayered insulating layer 25 to extend along a third direction D3, crossing both of the first and second directions D1 and D2. The bit lines BL may be formed to be in contact with the bit line node contact DC. An insulating spacer 31 may be formed to cover sidewalls of the bit lines BL, the bit line node contact DC, and the bit line node hole 26. A second interlayered insulating layer 33 may be formed on the first interlayered insulating layer 25.

A storage node contact BC may be formed to be in contact with the second doped region 22*b* through the second and first interlayered insulating layers 33 and 25. On the second interlayered insulating layer 33, a bottom electrode pad BEP may be formed to be in contact with the storage node contact BC and a third interlayered insulating layer 35 may be formed to cover a sidewall of the bottom electrode pad BEP. A third etch stop layer 37 may be formed on the third interlayered insulating layer 35. A bottom electrode BE may be formed to be in contact with the bottom electrode pad BEP through the third etch stop layer 37. A dielectric 38 and a top electrode layer TE may be conformally formed on the structure provided with the bottom electrode BE. A plate electrode 41 may be formed on the top electrode layer TE.

Hereinafter, structural features of the semiconductor device according to some example embodiments of inventive concepts will be described in more detail with reference to FIGS. 10A, 10B and 10C.

Referring to FIG. 10A, the active portions 1*b* may be defined by the first device isolation layer 3 and the second device isolation layer 19. The active portions 1b may be shaped like a bar elongated along the first direction D1. The word lines WL may extend along the second direction D2 crossing the first direction D1 and be spaced apart from each other. The bit lines BL may extend along the third direction D3 crossing both of the first and second directions D1 and D2 and be spaced apart from each other.

Referring to FIG. 10B the word lines WL may be formed to have an upper width W5 greater than a lower width W6. The second device isolation layer 19 may be provided below the word line WL. A width W2 of the second device isolation layer 19 measured along the first direction D1 may be greater than the lower width W6 of the word line WL and smaller than the upper width W5 of the word line WL.

Referring to FIG. 10C, the bottom surfaces of the word lines WL may have a concavo-convex structure. According to some example embodiments of inventive concepts, since the word lines WL are provided to surround top and side surfaces of the protruding active portions 1b, a gate electrode can have improved controllability on a channel region, like the fin field effect transistors. As a result, it is possible to suppress a drain-induced-barrier-lowering (DIBL) effect and a short channel effect of the device from occurring when the device is operated.

As described above, in the method of fabricating a semiconductor device according to the first example embodiment, the first device isolation layers 3 and the active lines 1a may be etched using the first mask pattern 5 to form the second groove 7a, where the word line WL will be formed. Then, the active lines 1a may be removed in a self-alignment manner using the first mask pattern 5 as a portion of an etch mask to form the active portions 1b. As a result, it is possible to prevent a mask misalignment from occurring.

Since the mask misalignment can be prevented, the active portions 1a can have a uniform length. Accordingly, the storage node contact BC and/or the bit line node contact DC can be in contact with the top surfaces of the active portions 1b with uniform contact area. This reduces cell-to-cell dispersion of electric properties.

Second Example Embodiment

Figure 11A:
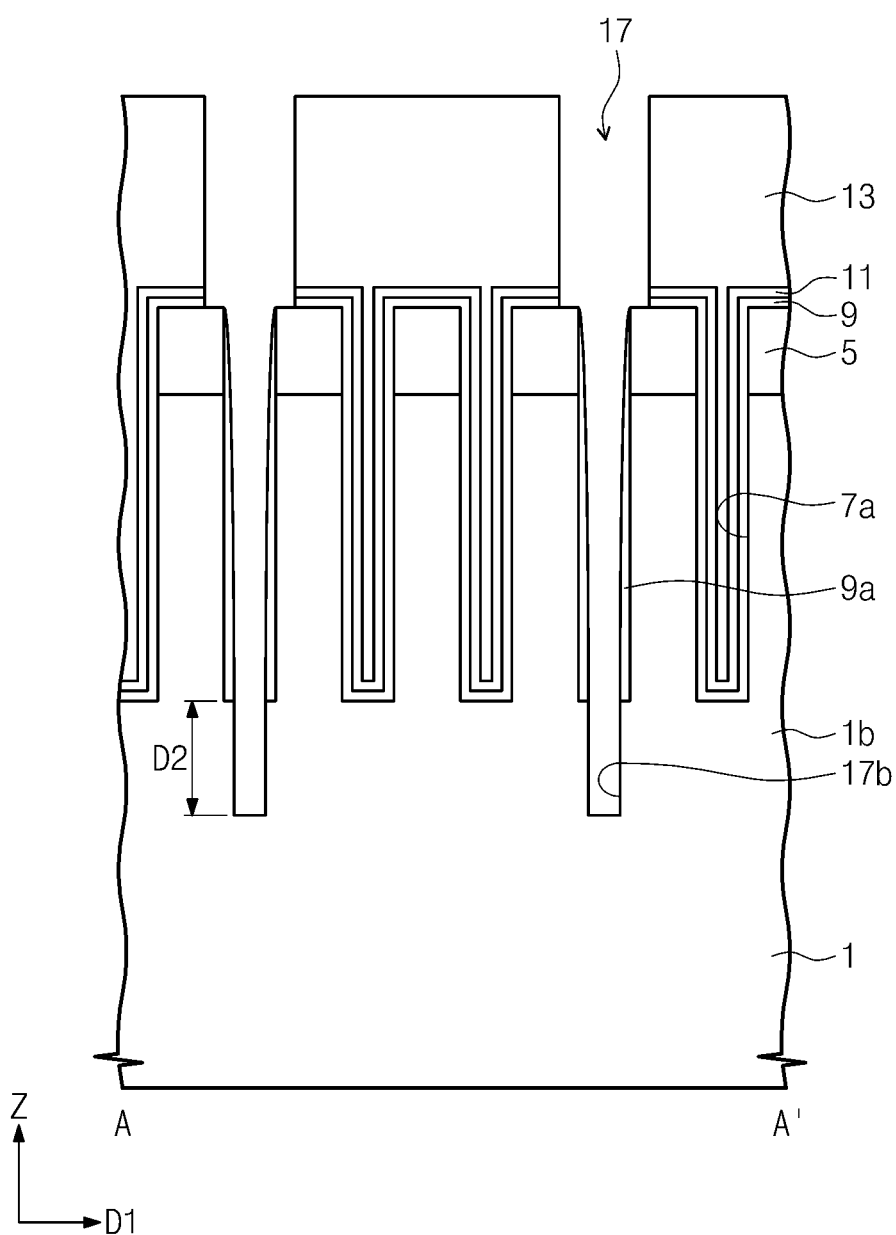
FIGS. 11A, 12A and 13A are sectional views illustrating a process of fabricating a semiconductor device according to a second example embodiment of inventive concepts.
Figure 11B:
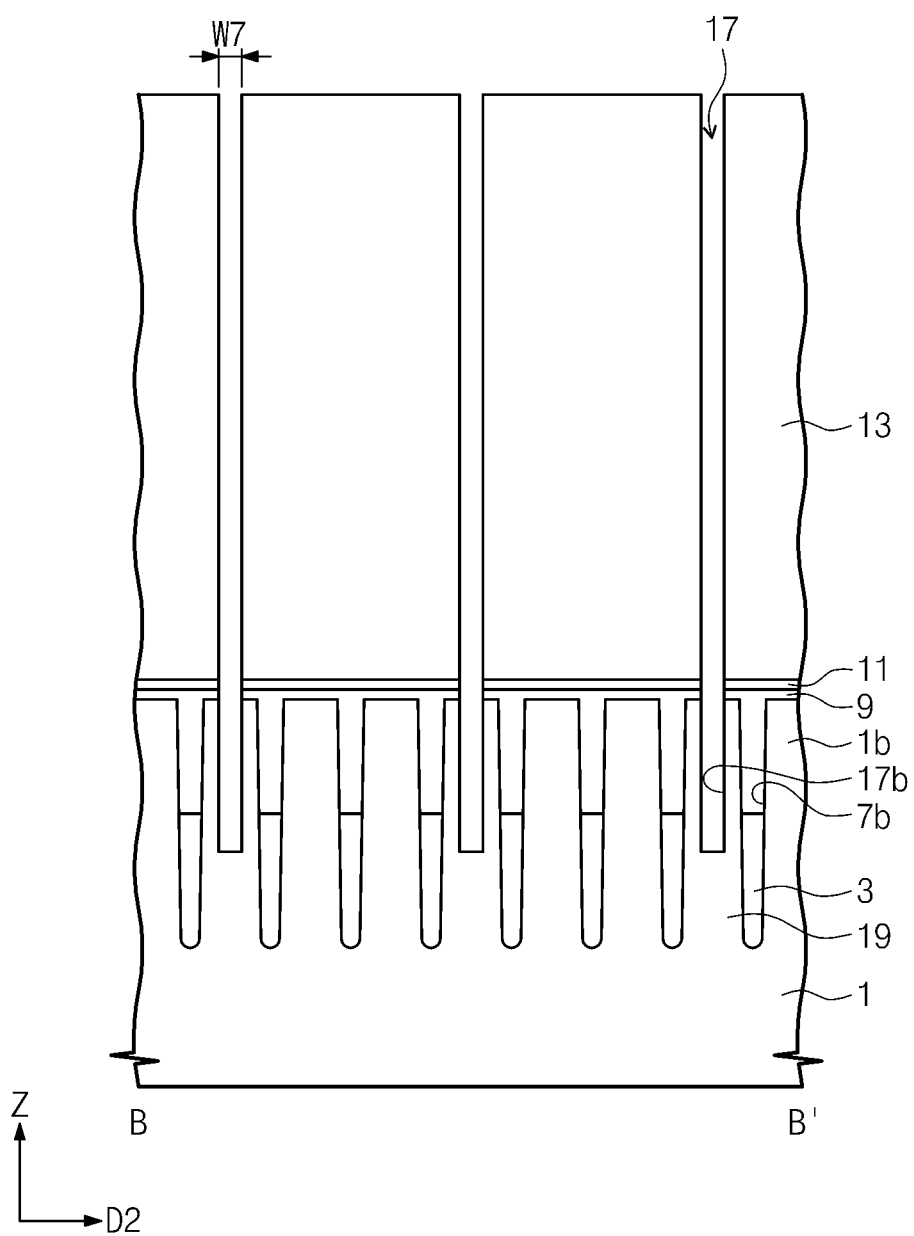
FIGS. 11B, 12B and 13B are sectional views illustrating the fabricating process according to the second example embodiment of inventive concepts.
Figure 12A:
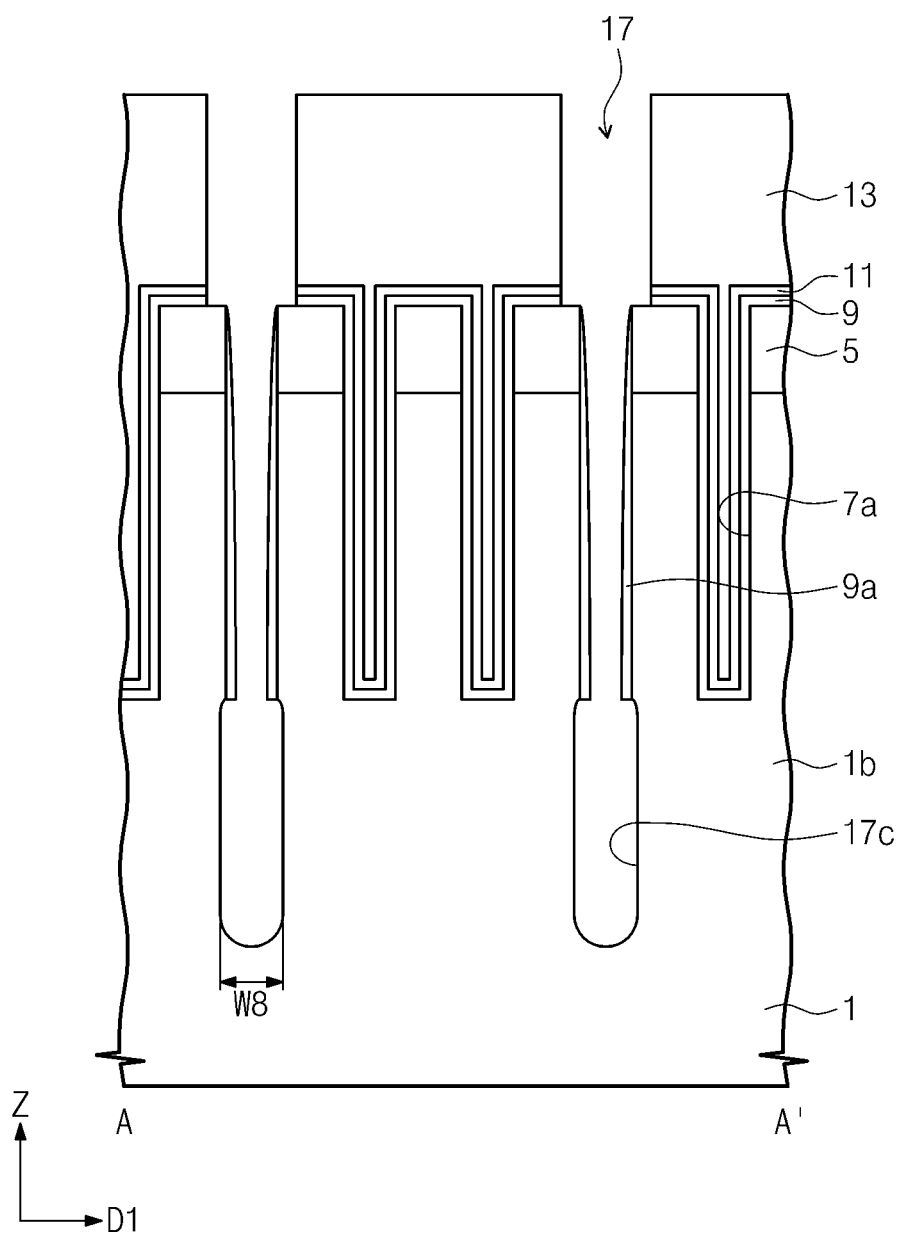
Figure 12B:
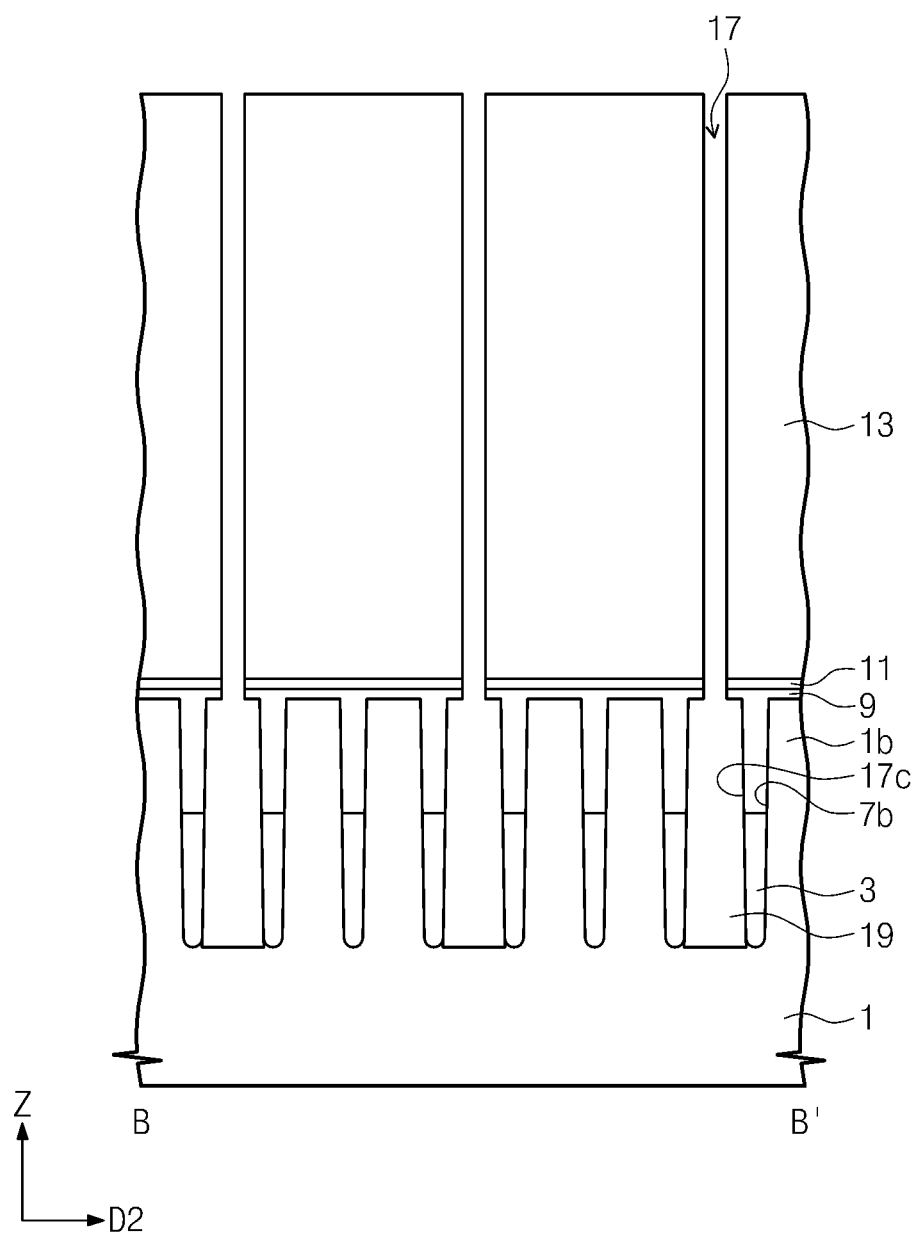
Figure 13A:
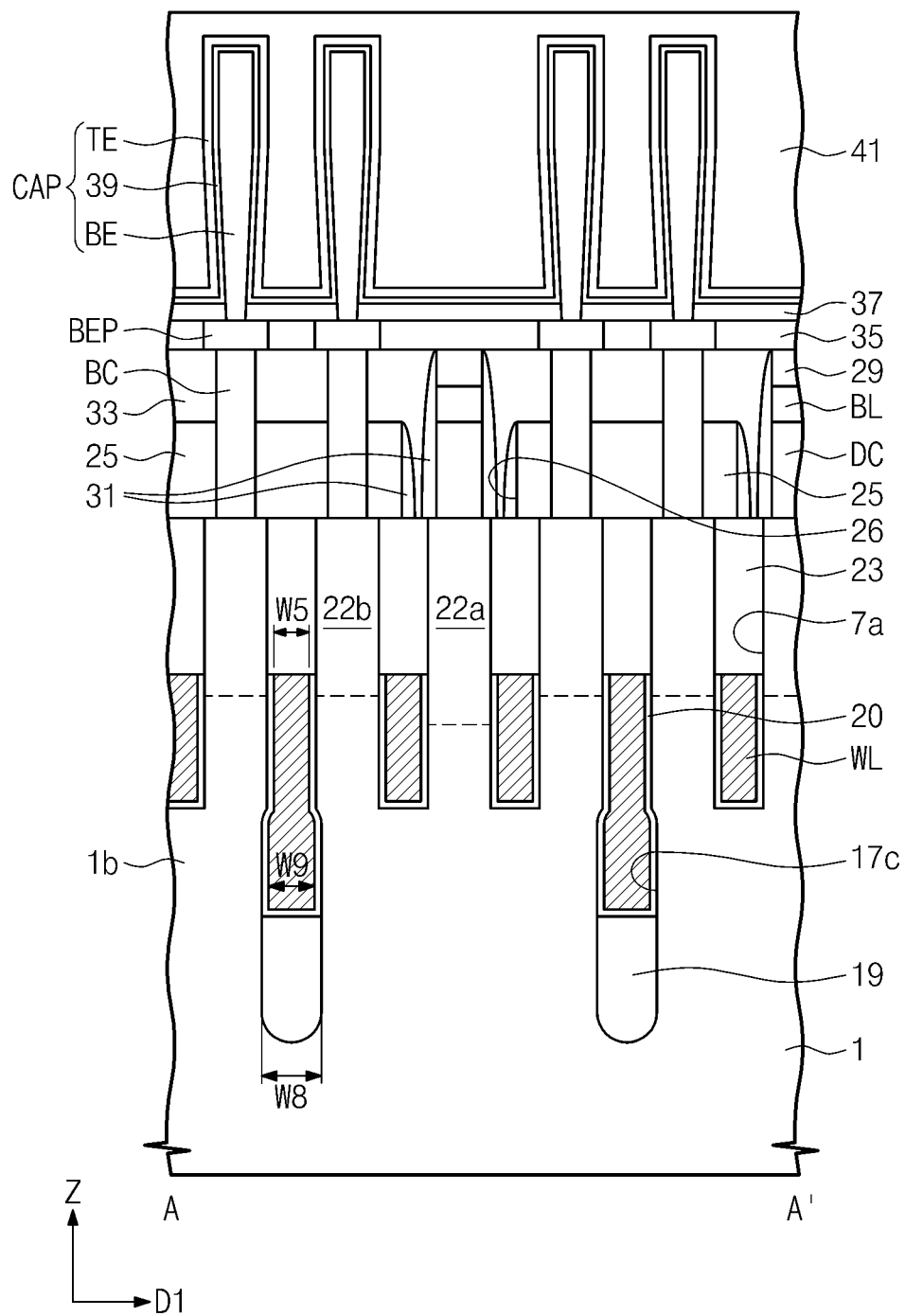
Figure 13B:
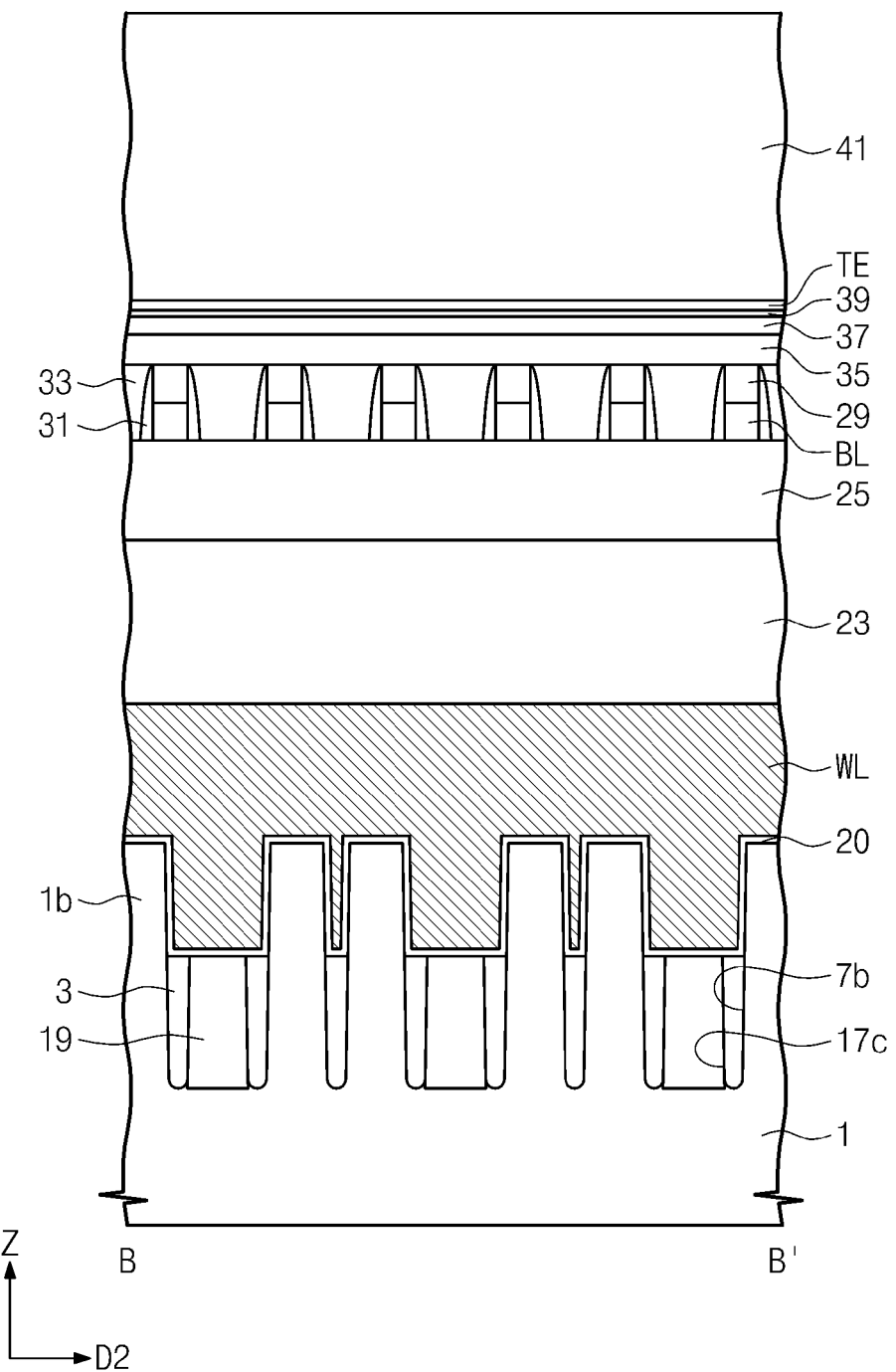

FIGS. 11A, 12A and 13A are sectional views illustrating a process of fabricating a semiconductor device according to a second example embodiment of inventive concepts, and FIGS. 11B, 12B and 13B are sectional views illustrating the fabricating process according to the second example embodiment of inventive concepts.

Referring to FIGS. 11A and 11B, the first hole 17 may be formed to have a width W7 smaller than the width W3 of the previous example embodiment described with reference to FIG. 6B, when measured along the second direction D2. The active line 1a may be etched using the second mask pattern 13 defining the first hole 17 as an etch mask to form a second hole 17b below the first hole 17. In some example embodiments, the second hole 17b may have a depth D2 that is shallower than the depth D1 of the previous example embodiment described with reference to FIG. 6A. The second hole 17b may be formed by an anisotropic etching process.

Referring to FIGS. 12A and 12B, an isotropic etching process may be performed to remove a portion of the active line 1a exposed by the second hole 17b and form a third hole 17c. In some example embodiments, a depth of the third hole 17c may be substantially equal to the depth D1 of the previous example embodiment described with reference to FIG. 6A. A width W8 of the third hole 17c may be greater than the width W2 of FIG. 6A. As the result of the isotropic etching process, the third hole 17c may have a rounded bottom surface. In addition, a bottom surface of the etch stop spacer 9a may be exposed by the third hole 17c.

The subsequent steps for fabricating a semiconductor device may be performed in the same or similar manner as the first example embodiment.

FIGS. 13A and 13B show a semiconductor device fabricated by the fabrication method according to the second example embodiment of inventive concepts.

Referring to FIGS. 13A and 13B, the word line WL may have an upper width W5 smaller than a lower width W9. Below the word line WL, the second device isolation layer 19 may be provided to have a rounded bottom surface. The width W8 of the second device isolation layer 19 may be greater than the lower width W9 of the word line WL. The widths W8 and W9 are dimensions measured along the first direction D1.

Except for the features described above, the fabrication method and structural features may be identical or similar to those of the first example embodiment.

Third Example Embodiment

Figure 14:
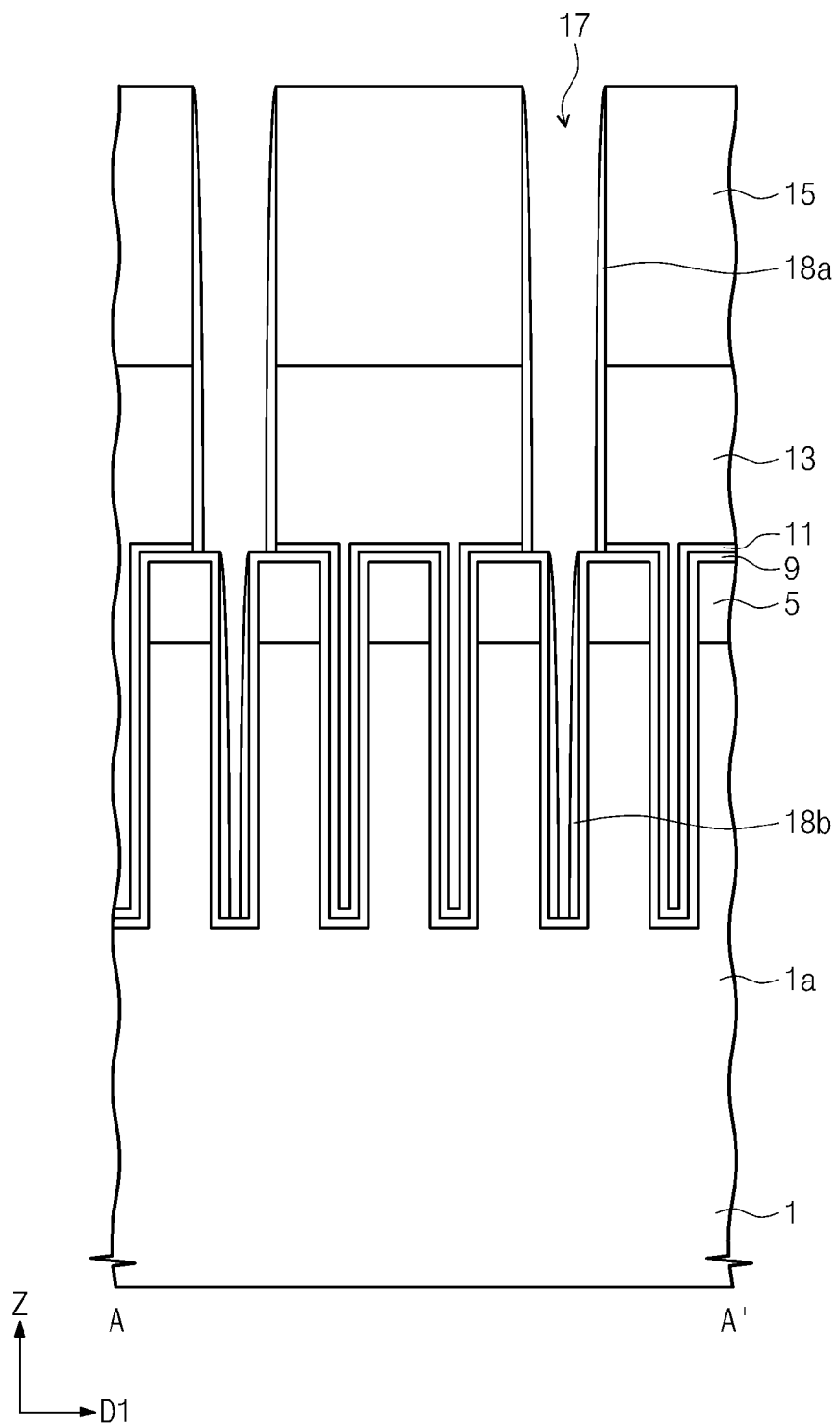
FIGS. 14 to 16 are sectional views illustrating a process of fabricating a semiconductor device according to a third example embodiment of inventive concepts.
Figure 15:
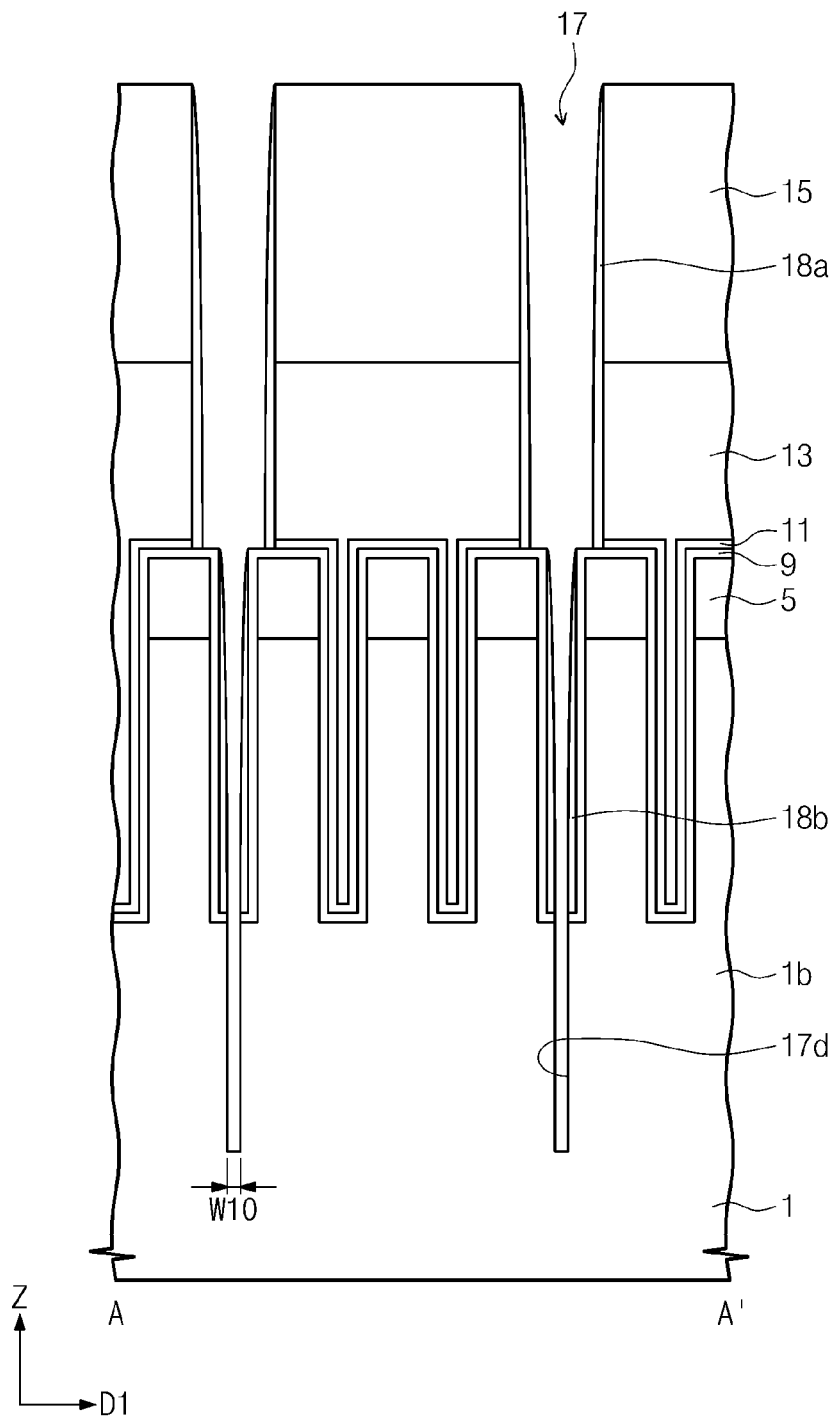
Figure 16:
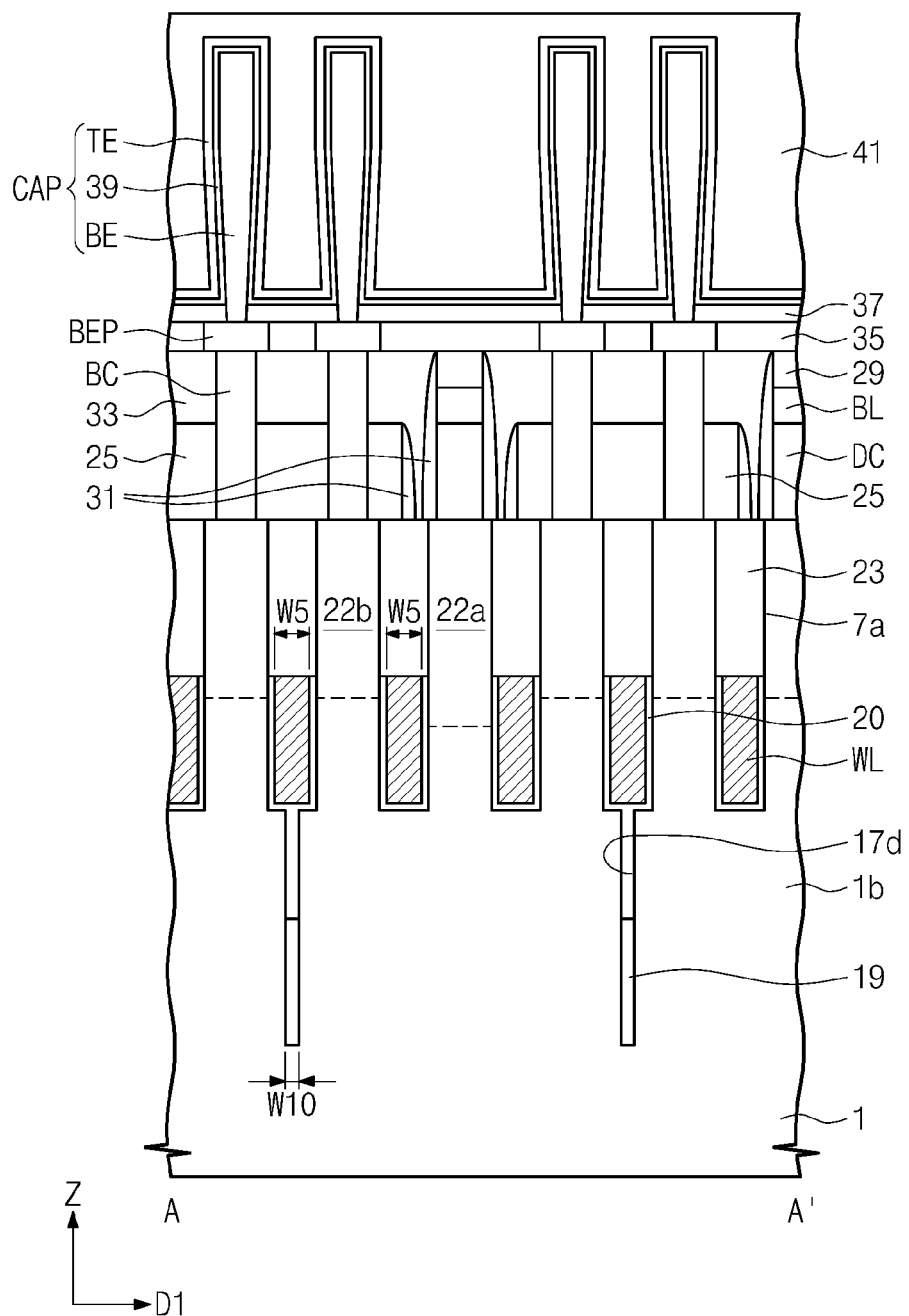

FIGS. 14 to 16 are sectional views illustrating a process of fabricating a semiconductor device according to a third example embodiment of inventive concepts.

Figure 4A:
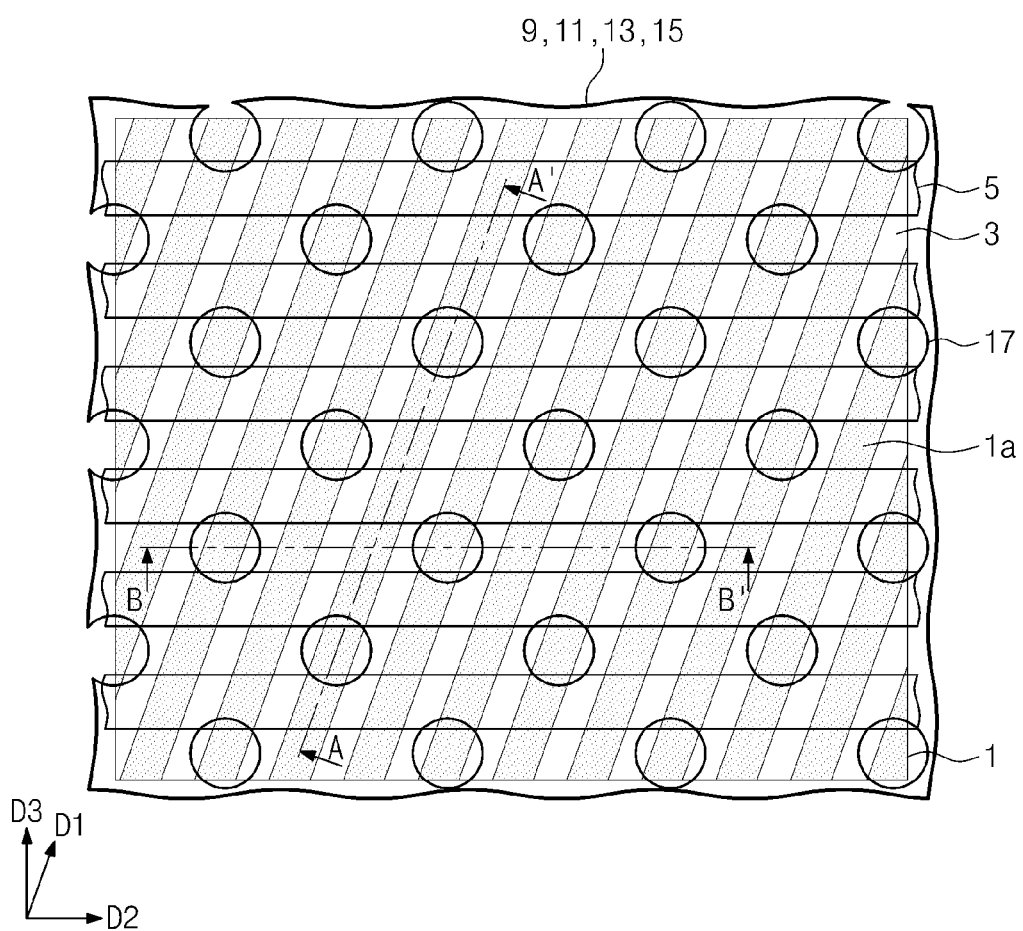
Figure 4B:
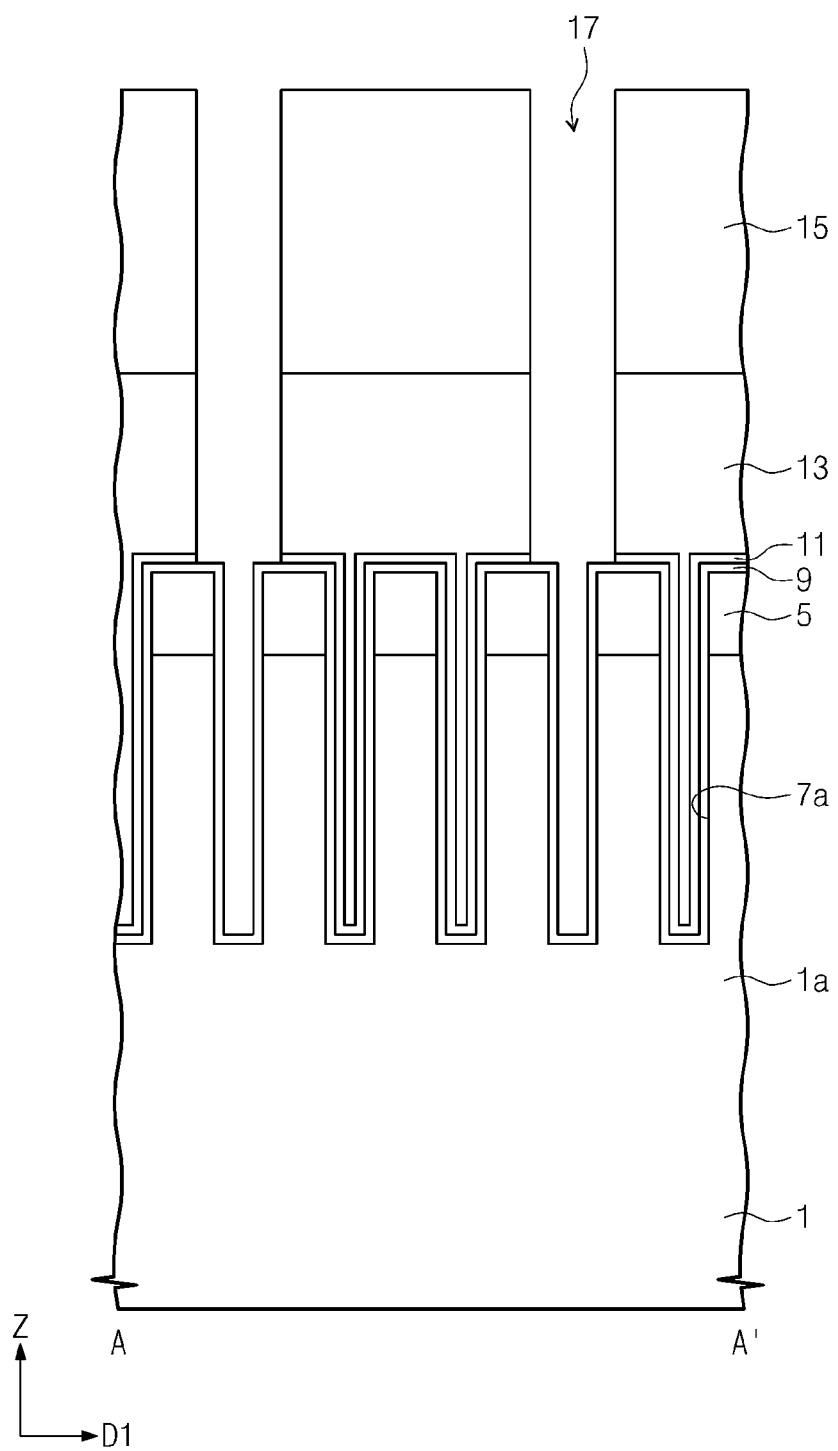
Figure 4C:
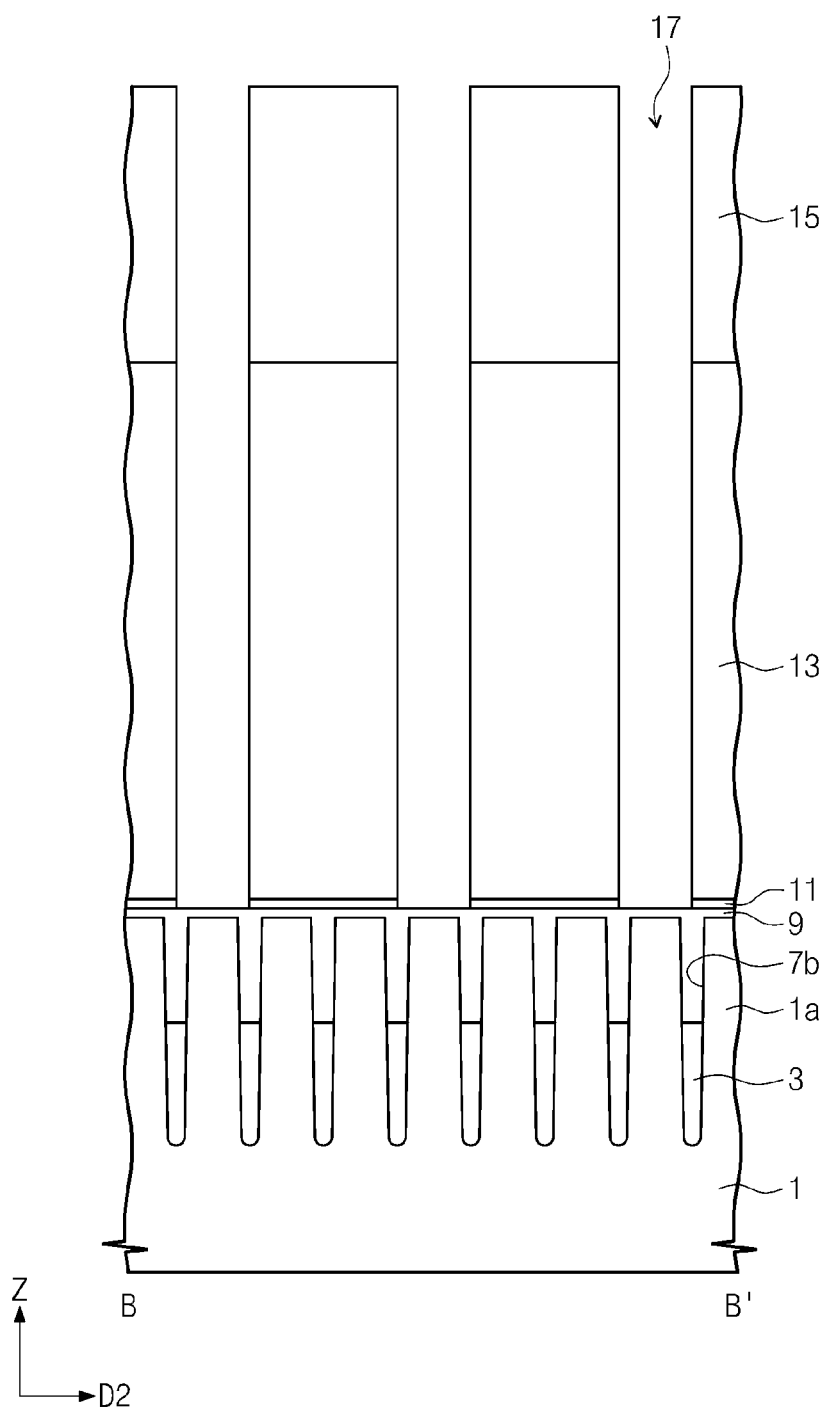
Figure 4D:
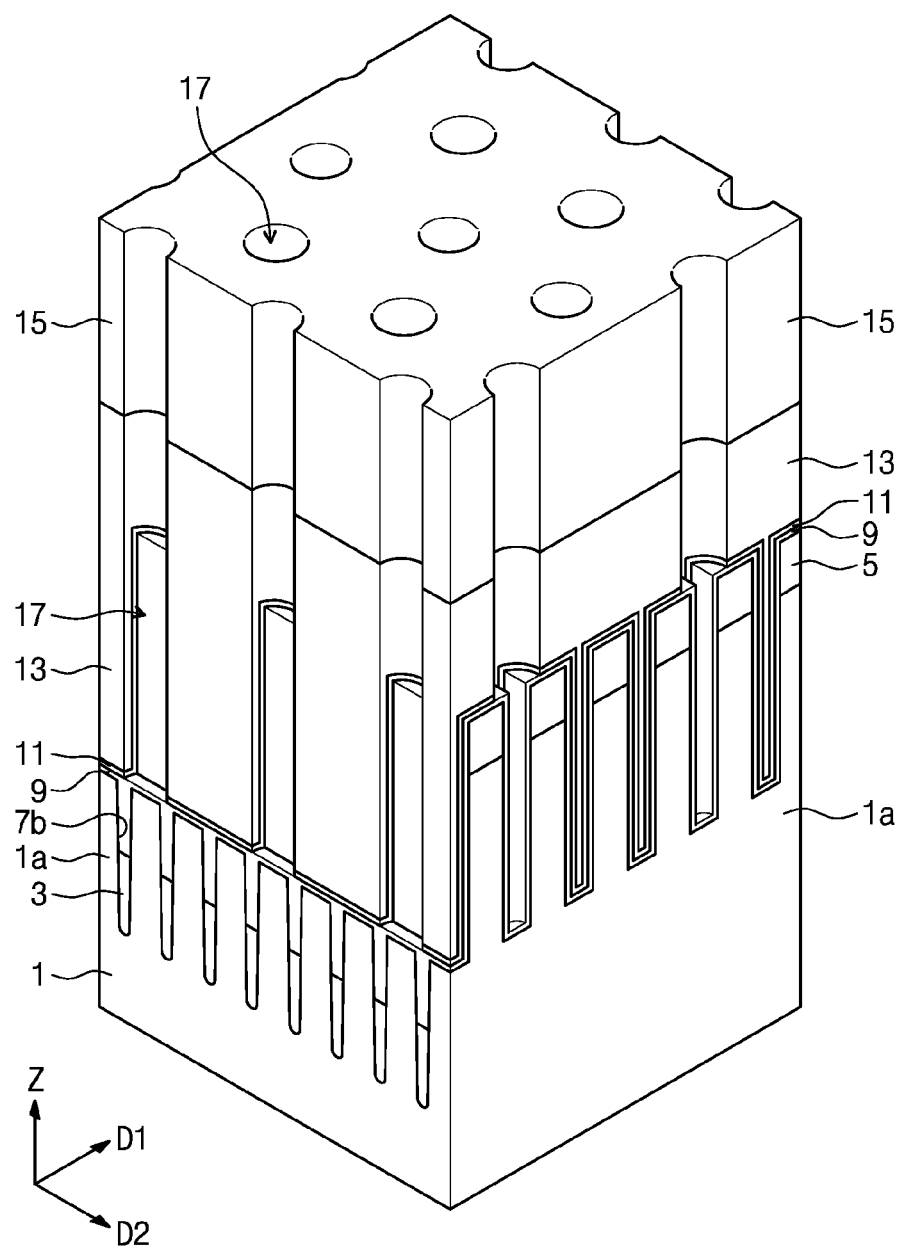

Referring to FIG. 14, a first supplementary spacer 18a and a second supplementary spacer 18b may be formed on the structure of FIG. 4B. The first supplementary spacer 18a may be formed to cover the sidewalls of the second and third mask patterns 13 and 15 exposed by the first hole 17, and the second supplementary spacer 18b may be formed to cover the sidewall of the first etch stop layer 9 exposed by the first hole 17.

Referring to FIG. 15, the first etch stop layer 9 below the first hole 17 and the active line 1a thereunder may be etched using the third mask pattern 15, the second supplementary spacer 18b, and the first mask pattern 5 as an etch mask. As a result, a second hole 17d may be formed overlapping the first hole 17, and the active portion 1b may be defined. Due to the use of the second supplementary spacer 18b, a width W10 of the second hole 17d may be reduced, compared with the width W2 in FIG. 6A. The second hole 17d may be formed to have the same depth as the depth D1 in FIG. 6A. In addition, a section taken along the line B-B' may be the same as that of FIG. 6B.

The subsequent process for forming a semiconductor device may be performed in the same manner as the first example embodiment. FIG. 16 shows the resulting structure of the semiconductor device fabricated by the process according to the third example embodiment of inventive concepts.

Referring to FIG. 16, a lower portion of the second hole 17d may be filled with the second device isolation layer 19, and an upper portion of the second hole 17d may be filled with the gate insulating layer 20. The width W10 of the second hole 17d may be much smaller than the width W5 of the word line WL, and thus, the word line WL may not be formed in the second hole 17d.

Except for the features described above, the fabrication method and structural features may be identical or similar to those of the first example embodiment.

Fourth Example Embodiment

Figure 17A:
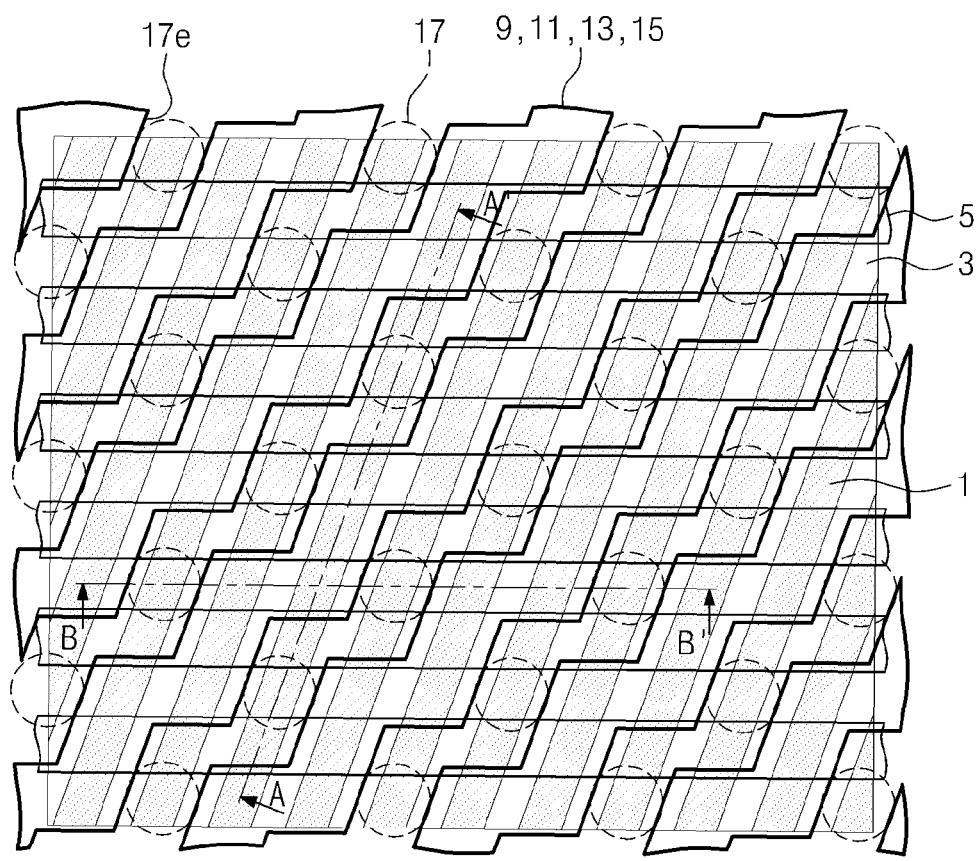
FIG. 17A is a plan view illustrating a process of fabricating a semiconductor device according to a fourth example embodiment of inventive concepts.
Figure 17B:
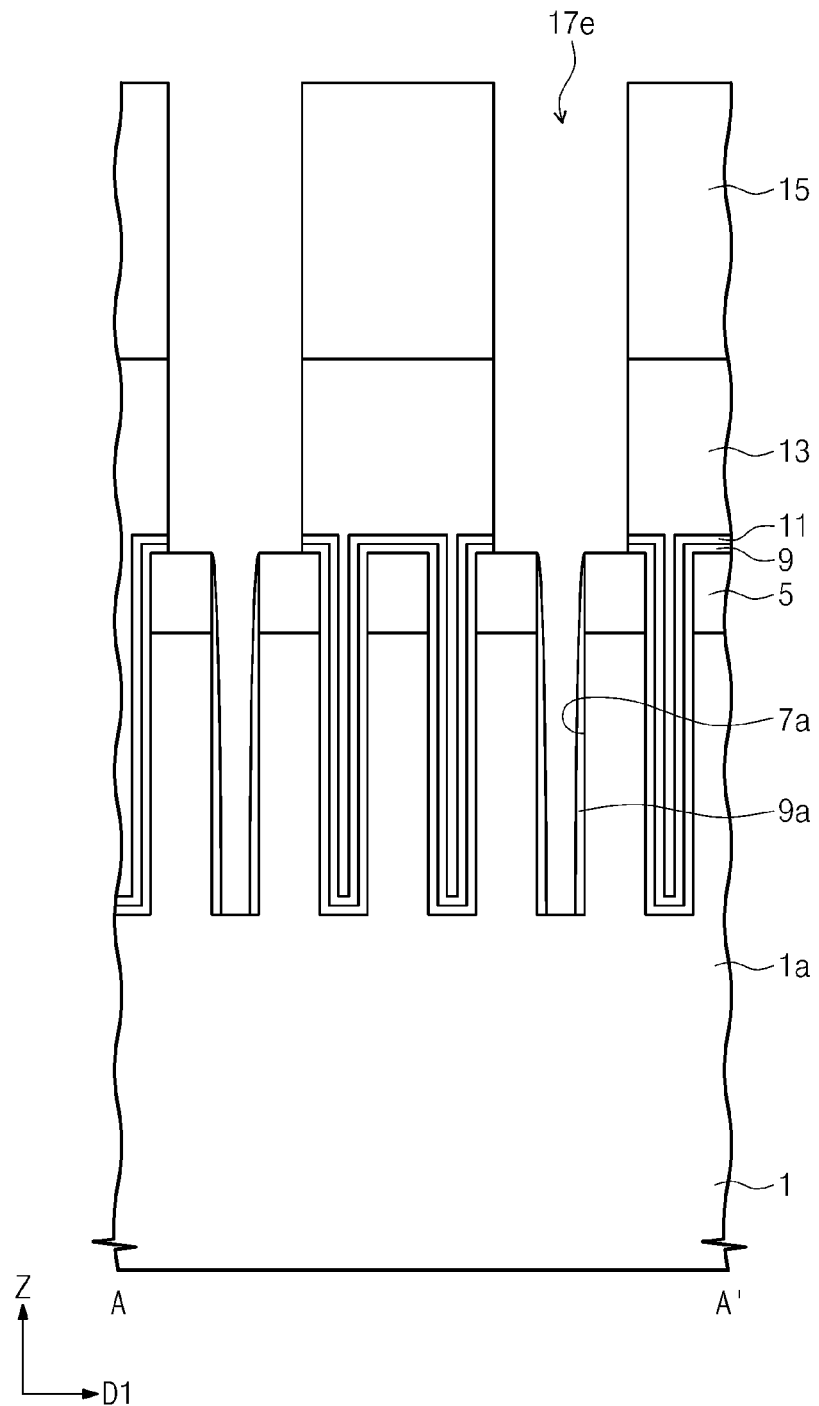
FIG. 17B is a sectional view taken along a line A-A' of FIG. 17A.

FIG. 17A is a plan view illustrating a process of fabricating a semiconductor device according to a fourth example embodiment of the inventive concept, and FIG. 17B is a sectional view taken along a line A-A' of FIG. 17A.

Figure 3A:
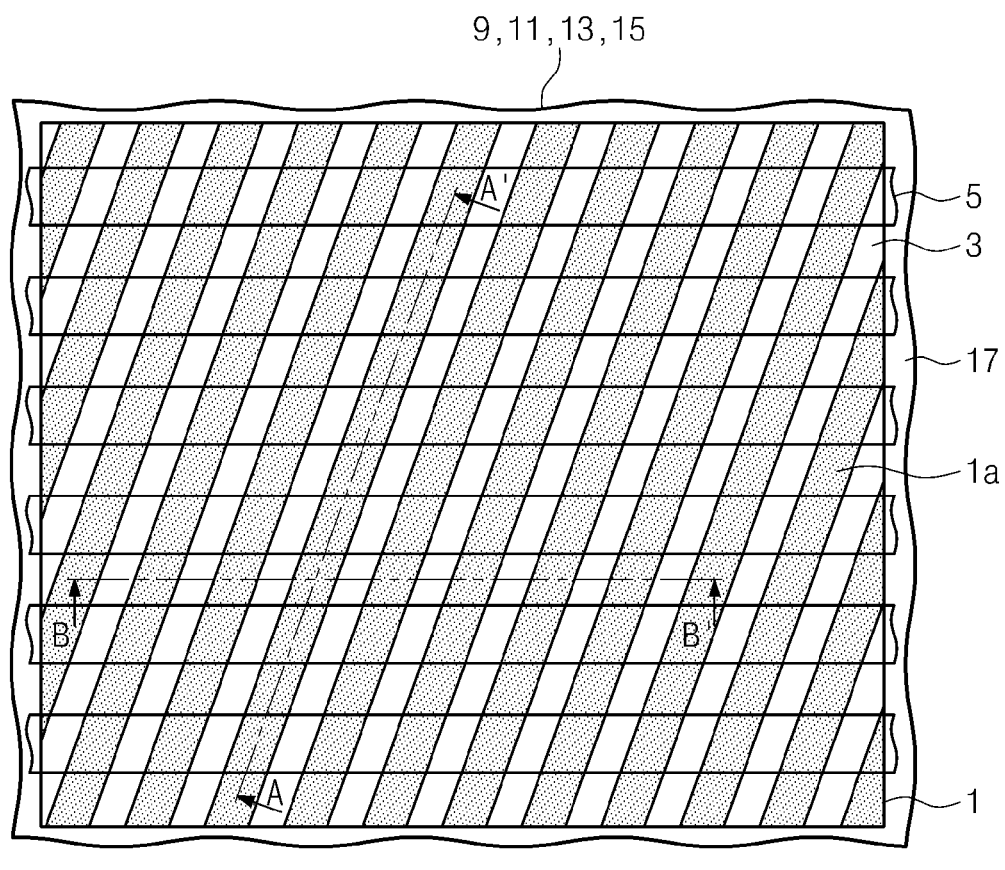
Figure 3B:
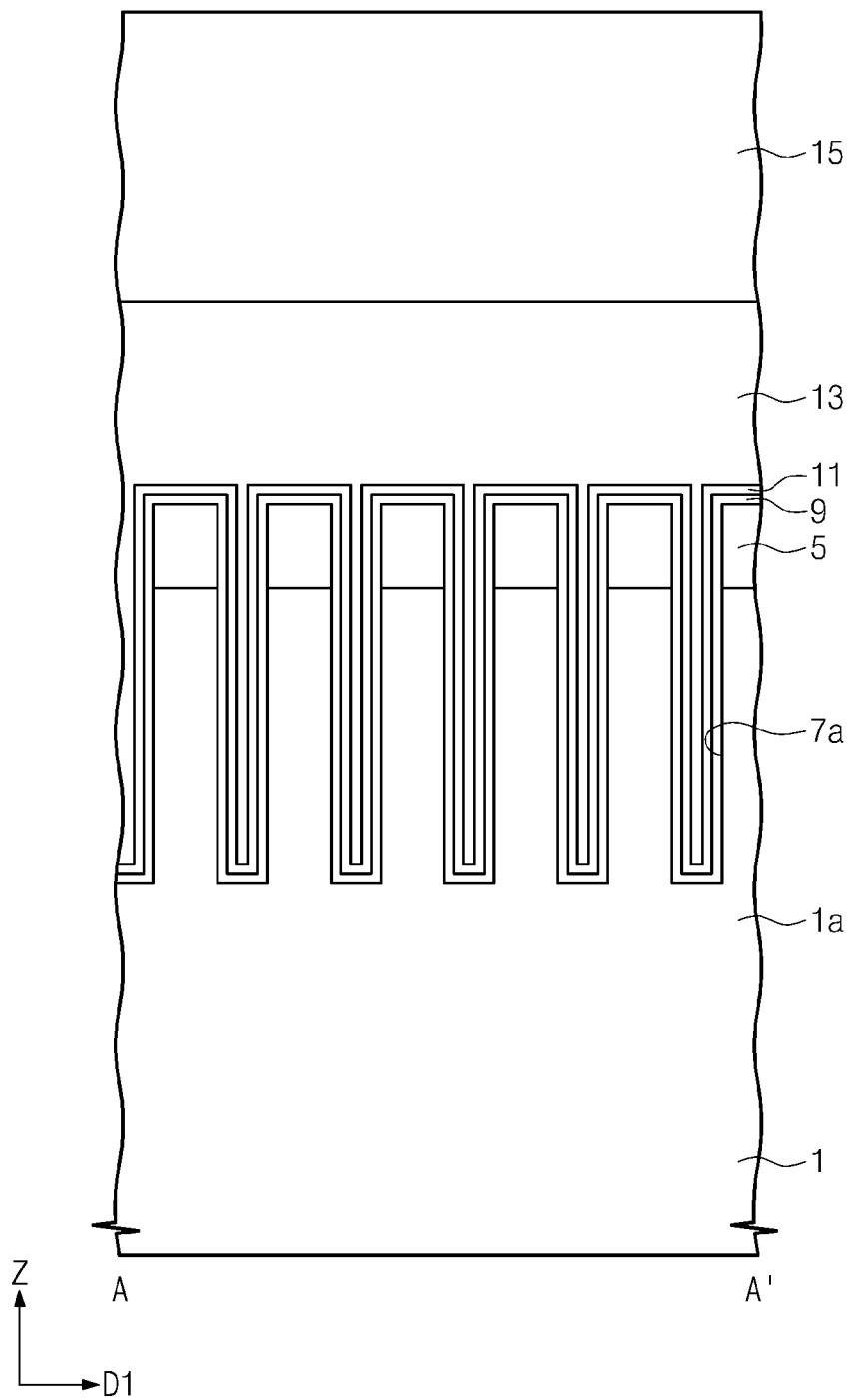
Figure 3C:
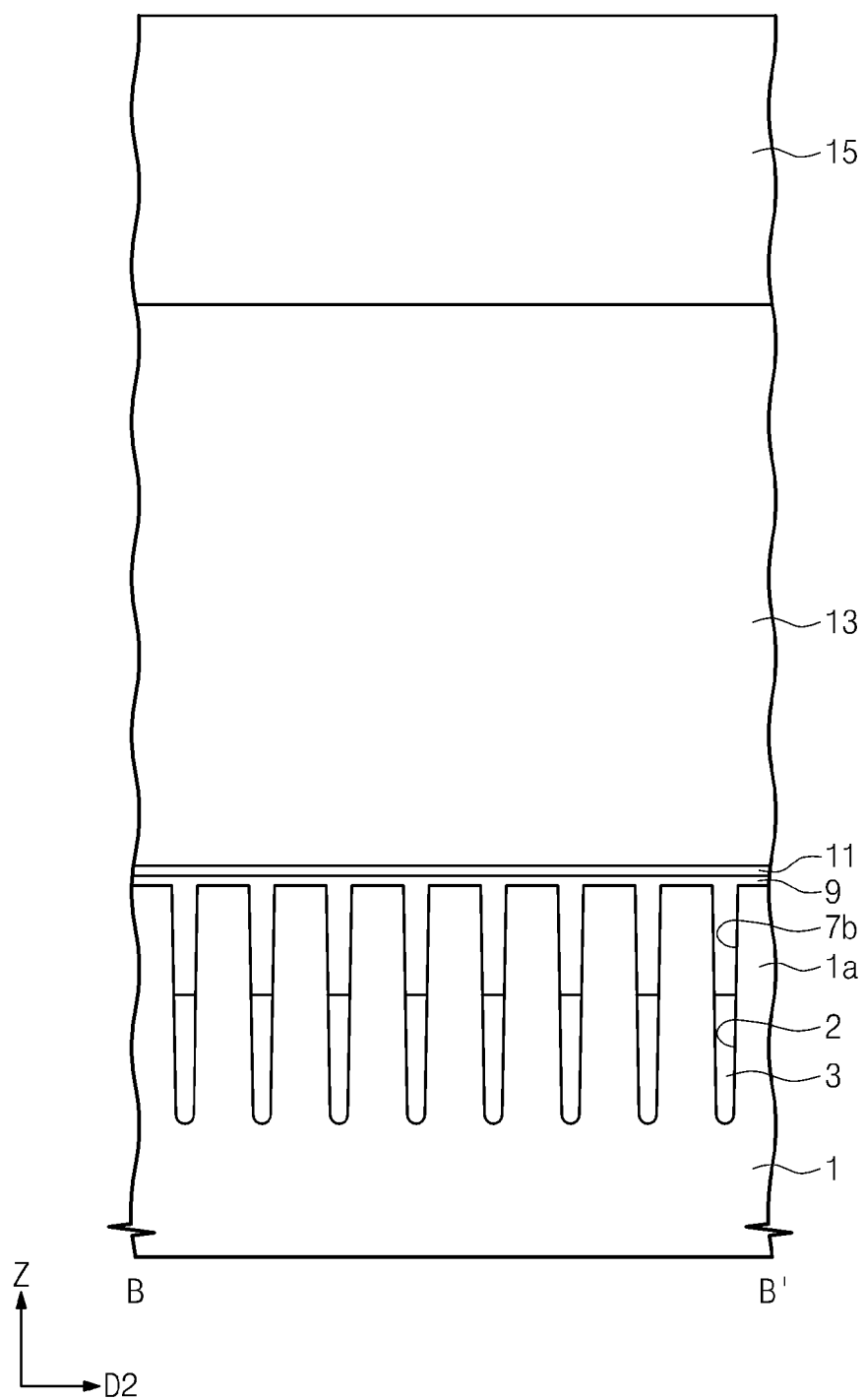
Figure 3D:
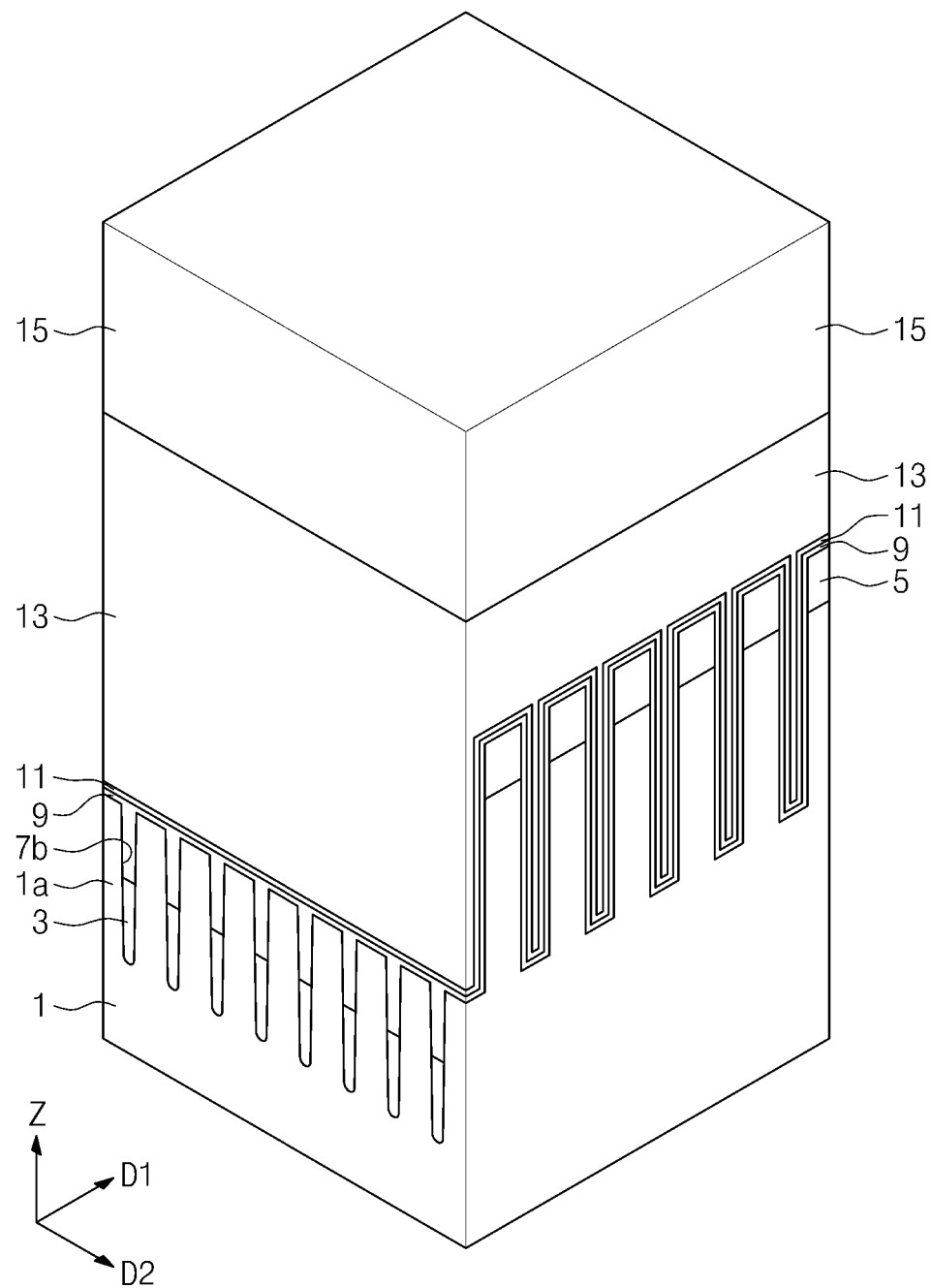

Referring to FIGS. 17A and 17B, an etching process may be performed on the structure of FIGS. 3A and 3B to sequentially etch the second and third mask layers 13 and 15. As the result of the etching process, the second mask pattern 13 and the third mask pattern 15 may be formed to define an opening 17e overlapped with the first holes 17 of FIG. 4A. From a plan view, the second and third mask patterns 13 and 15 may be formed to cross both the active line 1a and the first mask pattern 5. The second and third mask patterns 13 and 15 may be formed to have a stepwise shape. The opening 17e may increase an exposed area of the top surface of the first mask pattern 5. However, since the first mask pattern 5 serves as an etch mask, a top area of the active line 1a exposed by the etch stop spacer 9a may be substantially equivalent to that of the first example embodiment described with reference to FIG. 5A. As a result, the second hole 17a, which may be formed by etching the exposed portion of the active line 1a, and the active portion 1b may have the same shape and area as those of the first example embodiment.

Except for the features described above, the fabrication method and structural features may be identical or similar to those of the first example embodiment.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

Figure 18:
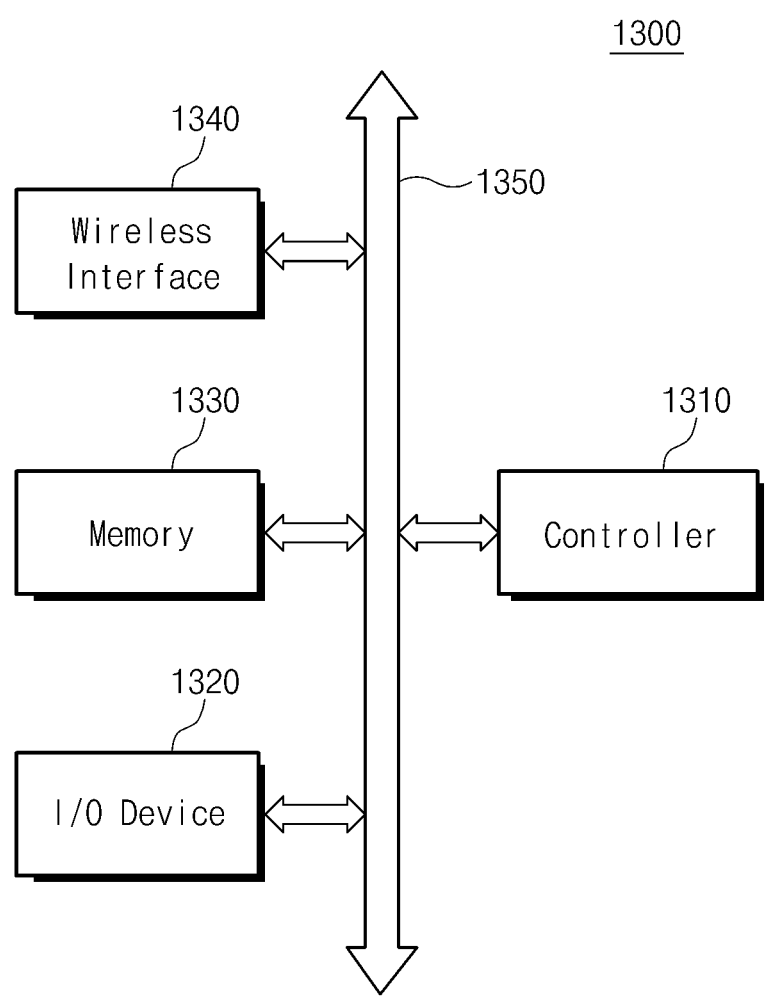
FIG. 18 is a block diagram schematically illustrating electronic devices including a semiconductor device according to some example embodiments of inventive concepts.

FIG. 18 is a block diagram schematically illustrating electronic devices including a semiconductor device according to some example embodiments of inventive concepts.

Referring to FIG. 18, an electronic device 1300 including a semiconductor device according to some example embodiments of inventive concepts may be used in one of a personal digital assistant (PDA), a laptop computer, a mobile computer, a web tablet, a wireless phone, a cell phone, a digital music player, a wired or wireless electronic device, or a complex electronic device including a combination thereof. The electronic device 1300 may include a controller 1310, an input/output device 1320 such as a keypad, a keyboard, a display, a memory 1330, and a wireless interface 1340 that are connected to each other through a bus 1350. The controller 1310 may include, for example, at least one microprocessor, a digital signal processor, a microcontroller or the like. The memory 1330 may be configured to store a command code to be used by the controller 1310 or a user data. The memory 1330 may include a semiconductor device including a vertical channel transistor according to some example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 19:
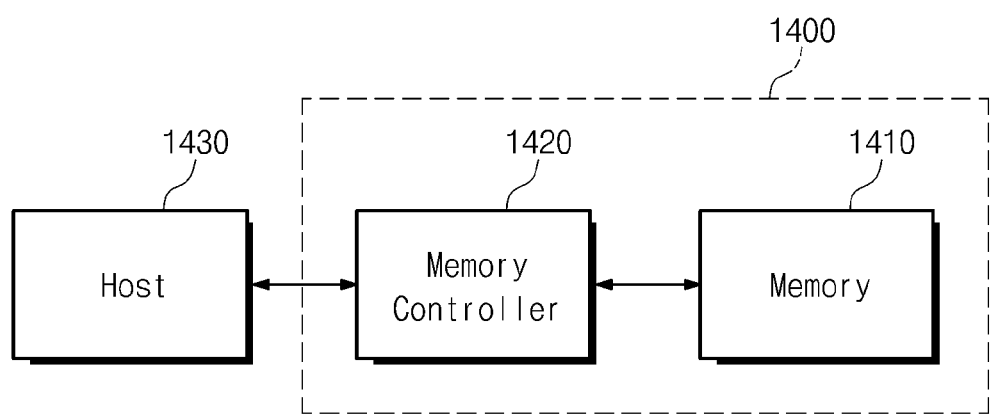
FIG. 19 is a block diagram schematically illustrating memory systems including a semiconductor device according to some example embodiments of inventive concepts.

FIG. 19 is a block diagram schematically illustrating memory systems including a semiconductor device according to some example embodiments of inventive concepts.

Referring to FIG. 19, a memory system including a semiconductor device according to some example embodiments of inventive concepts will be described. The memory system 1400 may include a memory device 1410 for storing huge amounts of data and a memory controller 1420. The memory controller 1420 controls the memory device 1410 to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a vertical channel transistor according to some example embodiments of inventive concepts.

According to some example embodiments of inventive concepts, a first mask pattern is used to etch first device isolation layers and active lines or form grooves, in which word lines will be provided. Thereafter, the active lines may be etched in a self-alignment manner by using the first mask pattern as an etch mask. As a result, it is possible to prevent mask misalignment from occurring.

Furthermore, due to the absence of the mask misalignment, active portions can have a uniform longitudinal length. As a result, a storage node contact and/or a bit line node contact can be formed to have a uniform contact area with a top surface of the active portion. This allows a semiconductor device to obtain improvement in cell uniformity.

While some example embodiments of inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    patterning a substrate to form a plurality of line-shaped first grooves extending along a first direction and active lines protruding from the substrate to delimit sidewalls of the first grooves;
    forming first device isolation layers to fill the first grooves;
    forming a plurality of line-shaped first mask patterns extending along a second direction on the substrate, the first and second directions crossing each other;
    etching the first device isolation layers and the active lines using the first mask patterns as an etch mask to form a plurality of second grooves;
    removing portions of the active lines exposed by the second grooves and spaced apart from each other to form bar-shaped active portions and first holes therebetween, the removing portions of the active lines exposing sidewalls of the first device isolation layers and extending along the first direction;

forming second device isolation layers to fill at least portions of the first holes;

forming word lines in the second grooves, wherein widths of the second grooves are different from widths of the first holes.

2. The method of claim 1, further comprising:

recessing a portion of the first device isolation layers at bottoms of the second grooves to expose sidewalls of the active lines.

3. The method of claim 1, wherein the forming of the active portions and the first hole comprises:

conformally forming an etch stop layer on the structure, in which the second grooves are formed;

forming a second mask pattern with second holes on the etch stop layer, the second holes overlapped with the first holes to expose the etch stop layer;

performing an anisotropic etching process to form etch stop spacer covering sidewalls of the first mask patterns and the active lines and to expose portions of the active lines at bottoms of the second grooves; and removing the exposed portions of the active lines to form the active portions and the first holes.

4. The method of claim 3, wherein widths of the second holes are greater than widths of the active lines, and the removing of the exposed portions of the active lines includes an anisotropic etching process.

5. The method of claim 3, wherein widths of the second holes are smaller than widths of the active lines, and the removing of the exposed portions of the active lines includes an isotropic etching process.

6. The method of claim 1, wherein the forming of the active portions and the first holes comprises:

conformally forming an etch stop layer on the entire surface of the structure provided with the second grooves;

forming a second mask pattern having second holes on the etch stop layer, the second holes overlapping the first holes to expose the etch stop layer;

forming a supplementary spacer to cover sidewalls of the etch stop layer;

removing the etch stop layer exposed by the supplementary spacer from a bottom of the second grooves to expose portions of the active lines; and removing the exposed portions of the active lines to form the active portions and the first holes.

7. The method of claim 1, wherein the forming of the active portions and the first holes comprises:

conformally forming an etch stop layer on the entire surface of the structure provided with the second grooves;

forming a second mask pattern having openings on the etch stop layer, the openings overlapping the first holes to expose the etch stop layer;

performing an anisotropic etching process to form first spacers covering sidewalls of the first mask patterns and the active lines and to expose portions of the active lines at a bottom of the second grooves; and removing the exposed portions of the active lines to form the active portions and the first holes.

8. The method of claim 7, wherein the second mask pattern is formed to have a stepwise shape and to cross both of the active lines and the first mask pattern.

9. A method of fabricating a semiconductor device, comprising:

forming word lines in a first direction on a substrate;

forming first device isolation layers to at least partially fill a plurality of line-shaped first grooves, the first grooves extending along a second direction, active lines protruding from the substrate to delimit sidewalls of the first grooves;

forming a plurality of second grooves along the first direction, the first direction and second direction crossing each other;

forming first holes in the second grooves;

forming second device isolation layers to at least partially fill the first holes, removing portions of the first device isolation layers exposed by the second grooves to form first recessed regions exposing sidewalls of the active lines; and removing portions of the active lines exposed by the second grooves and spaced apart from each other to form bar-shaped active portions and the first holes therebetween, the removing portions of the active lines extending along the second direction and exposing sidewalls of the first device isolation layers, wherein the word lines have first widths at a first height and second widths at a second height different from the first height, and the first height is higher than the second height and the first width is smaller than the second width, wherein the forming word lines forms the word lines in the second grooves and the first holes, and wherein the forming first holes includes, conformally forming an etch stop layer on the first device isolation layers and the active lines, the second grooves being formed in the etch stop layer;

forming a mask pattern with second holes on the etch stop layer, the second holes overlapping the first holes to expose the etch stop layer;

performing an anisotropic etching process to form an etch stop spacer covering sidewalls of the active lines and to expose portions of the active lines at bottoms of the second grooves; and removing the exposed portions of the active lines to form the active portions and the first holes.

10. The method of claim 9 wherein widths of the second holes are greater than that of the active lines, and the removing portions of the active lines includes an anisotropic etching process.

11. The method of claim 1, wherein the first holes are formed to have a depth from a bottom surface of the second grooves.

12. A method of fabricating a semiconductor device, comprising:

patterning a substrate to form first device isolation layers at least partially filling a plurality of line-shaped first grooves, the first grooves extending along a first direction;

forming active lines protruding from the substrate to delimit sidewalls of the first grooves;

etching the first device isolation layers and the active lines to form a plurality of second grooves along a second direction, the first direction and the second direction crossing each other;

removing portions of the active lines exposed by the second grooves to form first holes in the second grooves;

forming second device isolation layers to at least partially fill the first holes; and forming word lines in the second grooves and the first holes, wherein widths of the second grooves are different from widths of the first holes, and wherein the word lines have first widths at a first height and second widths at a second height different from the first height, and the first and second widths are different from each other.

* * * * *